(12) United States Patent
Scarsbrook et al.

(10) Patent No.: US 9,416,005 B2
(45) Date of Patent: Aug. 16, 2016

(54) SOLID STATE MATERIAL

(75) Inventors: Geoffrey Alan Scarsbrook, Ascot (GB); Daniel James Twitchen, Bracknell (GB); Matthew Lee Markham, Maidenhead (GB)

(73) Assignee: Element Six Technologies Limited, Didcot (GB)

( * ) Notice: Subject to any disclaimer, the term of this patent is extended or adjusted under 35 U.S.C. 154(b) by 1124 days.

(21) Appl. No.: 12/995,000

(22) PCT Filed: Jul. 22, 2009

(86) PCT No.: PCT/GB2009/001814
§ 371 (c)(1),
(2), (4) Date: Mar. 22, 2011

(87) PCT Pub. No.: WO2010/010344
PCT Pub. Date: Jan. 28, 2010

(65) Prior Publication Data
US 2011/0163291 A1     Jul. 7, 2011

(30) Foreign Application Priority Data
Jul. 23, 2008   (GB) .................................. 0813490.0

(51) Int. Cl.
*H01L 29/15*    (2006.01)
*B82Y 10/00*    (2011.01)
*G06N 99/00*    (2010.01)

(52) U.S. Cl.
CPC ............. *B82Y 10/00* (2013.01); *G06N 99/002* (2013.01)

(58) Field of Classification Search
CPC ............................ G06N 99/002; B82Y 10/00
USPC .......................................................... 257/9, 77
See application file for complete search history.

(56) References Cited

U.S. PATENT DOCUMENTS

| 5,127,983 A | 7/1992 | Imai et al. |
| 5,302,331 A | 4/1994 | Jenkins |

(Continued)

FOREIGN PATENT DOCUMENTS

| EP | 0 254 312 A1 | 1/1988 |
| EP | 0 421 397 A1 | 10/1991 |

(Continued)

OTHER PUBLICATIONS

Balasubramanian et al., "Ultralong spin coherence time in isotropically engineered diamond", Nature Materials 8 (2009) pp. 383-388.*

(Continued)

*Primary Examiner* — Jay C Kim
(74) *Attorney, Agent, or Firm* — Armstrong Teasdale LLP

(57) ABSTRACT

A solid state system comprising a host material and a quantum spin defect, wherein the quantum spin defect has a T2 at room temperature of about 300 μs or more and wherein the host material comprises a layer of single crystal CVD diamond having a total nitrogen concentration of about 20 ppb or less, wherein the surface roughness, $R_q$ of the single crystal diamond within an area defined by a circle of radius of about 5 μm centered on the point on the surface nearest to where the quantum spin defect is formed is about 10 nm or less, methods for preparing solid state systems and the use of single crystal diamond having a total nitrogen concentration of about 20 ppb or less in spintronic applications are described.

2 Claims, 16 Drawing Sheets

(56) References Cited

U.S. PATENT DOCUMENTS

| | | | |
|---|---|---|---|
| 5,334,283 | A | 8/1994 | Parikh et al. |
| 5,360,479 | A | 11/1994 | Banholzer et al. |
| 5,387,310 | A | 2/1995 | Shiomi et al. |
| 5,391,409 | A | 2/1995 | Shibata et al. |
| 5,400,738 | A | 3/1995 | Shiomi et al. |
| 5,419,276 | A | 5/1995 | Anthony et al. |
| 5,474,021 | A | 12/1995 | Tsuno et al. |
| 5,587,210 | A | 12/1996 | Marchywka et al. |
| 5,614,019 | A | 3/1997 | Vichr et al. |
| 5,672,430 | A | 9/1997 | Lu et al. |
| 5,704,976 | A | 1/1998 | Snail |
| 5,773,830 | A | 6/1998 | Lu et al. |
| 6,007,916 | A | 12/1999 | Satoh et al. |
| 6,132,816 | A | 10/2000 | Takeuchi et al. |
| 6,162,412 | A | 12/2000 | Fujimori et al. |
| 6,582,513 | B1 | 6/2003 | Linares et al. |
| 7,122,837 | B2 | 10/2006 | Linares et al. |
| 8,547,090 | B2 * | 10/2013 | Lukin ............... G01R 33/032 324/244.1 |
| 8,947,080 | B2 * | 2/2015 | Lukin ............... G01R 33/032 324/244 |
| 2004/0175499 | A1 | 9/2004 | Twitchen et al. |
| 2004/0177803 | A1 | 9/2004 | Scarsbrook et al. |
| 2004/0180205 | A1 | 9/2004 | Scarsbrook et al. |
| 2004/0194690 | A1 | 10/2004 | Twitchen et al. |
| 2004/0229464 | A1 | 11/2004 | Godfried et al. |
| 2006/0157713 | A1 | 7/2006 | Linares et al. |
| 2006/0234419 | A1 | 10/2006 | Linares et al. |
| 2007/0017437 | A1 | 1/2007 | Genis et al. |
| 2008/0170981 | A1 * | 7/2008 | Genis et al. .................. 423/446 |

FOREIGN PATENT DOCUMENTS

| | | |
|---|---|---|
| EP | 0 507 497 A1 | 10/1992 |
| EP | 0 582 397 A2 | 2/1994 |
| EP | 0 879 904 A1 | 11/1998 |
| EP | 0 918 100 A1 | 5/1999 |
| GB | 2 400 115 B | 4/2004 |
| GB | 2 379 451 B | 5/2004 |
| GB | 2 428 690 A | 2/2007 |
| GB | 2 411 895 B | 6/2007 |
| GB | 2 441 044 A | 2/2008 |
| JP | 2-107596 A | 4/1990 |
| JP | 6-183892 A | 7/1994 |
| JP | 8-130102 A | 5/1996 |
| WO | 01/96633 A1 | 12/2001 |
| WO | 2004/059046 A2 | 7/2004 |
| WO | 2007/009037 A1 | 1/2007 |
| WO | 2007/081492 A2 | 7/2007 |
| WO | 2008/090511 A1 | 7/2008 |
| WO | 2008/090513 A2 | 7/2008 |

OTHER PUBLICATIONS

Wrachtrup et al., "Quantum Computation Using the 13C Nuclear Spins Near the Single NV Defect Center in Diamond", Optics and Spectroscopy 91 (2001) pp. 429-437.*

Maze et al., "Electron spin decoherence of single nitrogen-vacancy defects in diamond", Physical Review B 78 (2008) 094303.*

Dutt et al., "Quantum Register Based on Individual Electronic and Nuclear Spin Qubits in Diamond", Science 316 (2007) pp. 1312-1316.*

Taylor et al., "High-sensitivity diamond magnetometer with nanoscale resolution", arXiv:0805.1367v1 (2008).*

Berman, G. P., et al, "Single-Spin Microscope with Sub-Nanoscale Resolution Based on Optically Detected Magnetic Resonance," J. App. Phys. (2005), pp. 1-4.

Gaebel, T., "Room-temperature coherent coupling of single spins in diamond," Nature Physics, vol. 2, Jun. 2006, pp. 408-413.

Hunn, J.D., et al., "Fabrication of single-crystal diamond microcomponents," Appl. Phys. Lett., 65(24), Dec. 12, 1994, pp. 3072-3074.

Samlenski, R., et al., "Incorporation of nitrogen in chemical vapor deposition diamond," Appl. Phys. Lett. 67, (1995), pp. 2798-2800.

Schauer, S. N., et al., "Phosphorus incorporation in plasma deposited diamond films," Appl. Phys. Lett., 64(9), Feb. 28, 1994.

Hunn, J.D., et al., "Ion beam and laser-assisted micromachining of single-crystal diamond," Solid State Technology, 37(12), Dec. 1, 1994, pp. 57-60.

Plano, M.A., et al., "Characterization of a Thick Homoepitaxial CVD Diamond Film," Symposium, Diamond, SIC and Nitride Wide Bandgap Semiconductors, 307-312, San Francisco, CA, Apr.-Aug. 1994.

McCauley, T.S., et al. "Homoepitaxial diamond film deposition on a brilliant cut diamond anvil," Appl. Phys. Lett., 66 (12), Mar. 20, 1995, pp. 1486-1488.

Kennedy, T.A., et al., "Single-Qubit Operations with the Nitrogen-Vacancy Center in Diamond," Phys. Stat. Sol. (b), 233, (2002), pp. 416-426.

Kennedy, T.A., et al., "Long coherence times at 300 K for nitrogen-vacancy center spins in diamond grown by chemical vapor deposition," Appl. Phys. Lett., 83, (2003), pp. 4190-4192.

Weima, J.A., et al., "Surface analysis of ultraprecise polished chemical vapor deposited diamond films using spectroscopic and microscopic techniques," J. Appl. Phys., 89, (2001), pp. 2434-2440.

Stammler, M., et al., "Growth of high-quality homoepitaxial diamond films by HF-CVD," Diamond & Related Materials, 11, (2002), pp. 504-508.

Liang, Q., et al., "Effect of nitrogen addition on the morphology and structure of boron-doped nanostructured diamond films," Appl. Phys. Lett., 83(24), Dec. 15, 2003, pp. 5047-5049.

Charnock, F.T., et al., "Combined optical and microwave approach for performing quantum spin operations on the nitrogen-vacancy center in diamond," Phys. Rev. B, 64, (2001), 041201.

Hutchings, I.M., "Tribology: Friction and wear of engineering materials," Pub. Edward Arnold (London), 1992, 8-9.

Jelezko, F., et al., "Single spin states in a defect center resolved by optical spectroscopy," Appl. Phys. Lett., 81(12), Sep. 16, 2002, pp. 2160-2162.

Redman, D., et al., "Origin of persistent hole burning of N-V centers in diamond," J. Opt. Soc. Am. B., 9, (1992), p. 768.

Tamarat, P., et al., "Ten years of single-molecule spectroscopy," J. Phys. Chem. A, 104 (2000), pp. 1-16.

PCT Search Report for PCT/GB2009/001814 dated Oct. 16, 2009.
PCT Search Report for PCT/GB2009/001826 dated Jan. 4, 2010.

* cited by examiner

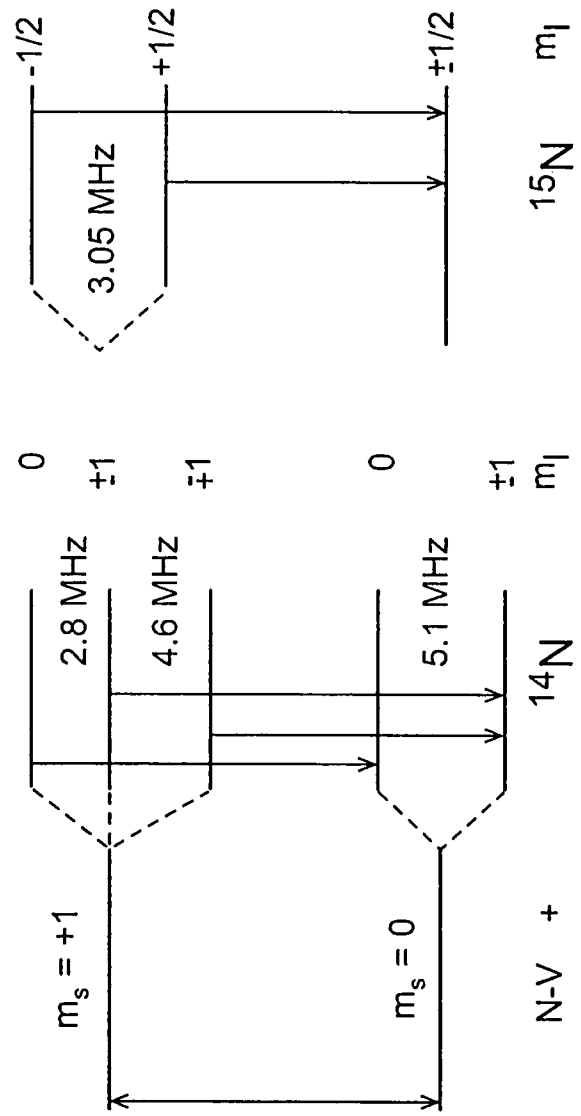

SOLID STATE MATERIAL

The present invention relates to solid state systems comprising a diamond host material and a quantum spin defect. The quantum spin defects in such systems have a long decoherence (T2) time and the solid state systems are therefore particularly suitable for spintronic applications.

Over the last 20 years there has been substantial interest in the use and manipulation of single photon sources for the two principal application areas of cryptography and quantum computing.

These application areas use a fundamental property which exists in nature on a quantum scale; until a measurement is made, a particle which has two spin states has to be considered as a particle having a superposition of all spin states.

The spin state of a particle e.g. a photon, electron, atomic nucleus, atomic defect, etc, with discrete spin states can be manipulated using a number of methods and the spin state can be detected and/or controllably altered, using an energy source or detector. An electron, photon, atomic nucleus or atomic defect with discrete spin states is analogous to a "bit" in a traditional computer and is termed a "quantum bit" (or "qubit" or "qbit"). However, due to the quantum nature of the spin states, a qubit can exist in not just one of two spin states, but also in a superposition of these spin states. It is this superposition of spin states which makes it possible for qubit based computers to compute certain problems at a much greater speed than is possible for classical computers, and in cryptography applications enable a sender to know for certain if a message has been delivered to a receiver without an eavesdropper also learning of the message's contents.

The key elements required for quantum information processing are: low error coding of qubits onto individual quantum systems; storage of quantum information for long limes compared to the gate times; and controllable two-qubit interactions forming fast quantum gates.

A large number of materials and structures have been proposed for use as qubit hosts ranging from quantum dot semiconductors to super-cooled ion traps. The alternatives to date suffer the disadvantage of operation only being possible at cryogenic temperatures or having very short transverse relaxation lifetimes (referred to as "T2"). In contrast, the nitrogen-vacancy ("NV") defect in diamond can have a T2 that is sufficiently long for its use in a range of applications at room temperature (about 300 K). The NV centre in diamond can be used for qubit applications since it has discrete quantised magnetic spin states. The NV centre has been thoroughly characterized using techniques such as electron paramagnetic resonance (EPR), photoluminescence (PL), optical absorption spectroscopy and spectroscopy under uniaxial stress. In diamond the NV centre has been identified in both the neutral and negative charge states ("$NV^0$" and "$NV^-$" respectively). The NV centre in its negative charge state ($NV^-$) has a zero phonon line ("ZPL") at 637 nm compared with 575 nm for an NV centre in the neutral state ($NV^0$).

One major problem in producing materials suitable for qubit applications is preventing the qubits from decohering, or at least lengthening the time a system takes to decohere (i.e. lengthening the "decoherence time"). Decoherence is commonly understood to be the process by which quantum becomes classical; the process by which the determinism of the macroscopic world arises out of the superpositions and entanglements that describe the quantum one. Decoherence times may be quantified and compared using the transverse relaxation time T2. T2 is terminology used in NMR (nuclear magnetic resonance) and MRI (magnetic resonance imaging) technology and is also known as the "dephasing time" or the "spin-spin relaxation time". Transverse relaxation describes the relaxation of an excited magnetic moment that is perpendicular to a main magnetic field applied to a material back to equilibrium, that is, parallel to the magnetic field. A long T2 time is desirable in applications such as quantum computing as it allows more time for the operation of an array of quantum gates and thus allows more complex quantum computations to be performed.

In a particular material, the decoherence time can be related to the specific magnetic moment being considered, for example in diamond, the magnetic moment associated with the nucleus of a $^{13}C$ atom may have a different T2 compared with the magnetic moment of the electronic spin state of an $NV^-$ centre. Each of these magnetic moments can be advantageously used in quantum applications, although in many respects they show different benefits and limitations in this type of application, and so it is important to be clear about which magnetic moment the T2 is being reported. In this specification, unless indicated otherwise, "T2" will refer to the decoherence time of the electronic spin state of the quantum spin defect, for example the $NV^-$ centre in diamond, and other T2 values will be suitably qualified, e.g. "$T2[^{13}C]$" will refer to the T2 time for the $^{13}C$ nuclear magnetic moment.

In U.S. Pat. No. 7,122,837, NV centres in diamond are created in a controlled manner. In one embodiment, a single crystal diamond is formed using a CVD process, and then annealed to remove NV centres. A thin layer of single crystal diamond is then formed with a controlled number of NV centres. The NV centres form qubits for use in electronic circuits. Masked and controlled ion implants, coupled with annealing are used in CVD-formed diamond to create structures for both optical applications and nanoelectromechanical device formation. Waveguides may be formed optically coupled to the NV centres and further coupled to sources and detectors of light to interact with the NV centres.

Kennedy and Linares (Phys. Stat. Sol. (b), 233 (2002), 416-426) disclose diamond containing NV centres with a T2 of 32 μs at temperatures form 1.5 to 100 K.

The internal optical transitions within the $NV^-$ defect take typically about 10 ns. For a viable quantum computing device the T2 time must be much greater than this to enable enough gate operations for error correction etc. Hence a T2 time of more than about 500 μs (0.5 ms) offers a respectable number of gated operations, typically about $5\times10^4$, before decoherence is lost.

A further important parameter for some applications is related to the temporal spectral stability of the optical transition which can be used to read/write information from the NV qubit. This is especially important where entanglement is to be achieved between the photons emitted from the individual qubits. The frequency of these photons must be identical to ensure one of the conditions of indistinguishability needed for quantum entanglement.

On the basis of the above, it is clear that there is a need for solid state systems comprising a host material and a quantum spin defect, wherein the quantum spin defects have higher T2 times, at room temperature, than have been demonstrated currently. In addition, it would be desirable to provide these quantum spin defects in a form and/or location which is readily accessible for characterisation and "read out", as required by the end application. It is further desirable that the frequency of the optical transition used to read/write to such quantum spin defects is stable.

In this regard, the present inventors have found that single crystal diamond material which has a high chemical purity, i.e. a low nitrogen content and wherein a surface of the diamond material has been processed to minimise the presence of crystal defects, can be used to form a solid state system comprising a quantum spin defect. Surprisingly, it has been found that where such materials are used as a host for quantum spin defects, long T2 times are obtained at room temperature and the frequency of the optical transitions used to read/write to the devices are stable.

Thus, the present invention provides a solid state system comprising a host material and a quantum spin defect, said quantum spin defect having a T2 at room temperature of about 300 µs or more, wherein the host material comprises a layer of single crystal CVD diamond having a total nitrogen concentration of about 20 ppb or less, wherein the surface roughness, $R_q$ of the single crystal diamond within an area defined by a circle of radius of about 5 µm centred on the point on the surface nearest to where the quantum spin defect is formed is about 10 nm or less.

In the solid state systems according to the present invention, the quantum spin defect, for example an NV defect, has a surprisingly long T2 value at room temperature.

By virtue of the techniques used to perform read out of a quantum spin defect, and also the method of its preparation, for example implantation techniques where it is only possible to introduce defects within a few microns of the surface, this characterisation is normally carried out on the region of the material within about 100 µm of a surface of the host material. It is therefore desirable that this region of the host material is of particularly high quality (i.e. substantially damage free) and that the quantum spin defects are positioned in this region of the material such that they are readily accessible. In this regard, the present inventors have found that, by processing a surface of the single crystal diamond host material so as to achieve a low surface roughness $R_q$, high T2 values and high spectral stability can be obtained where the synthetic diamond material of the present invention is used as a host material where the quantum spin defect is to be positioned at a distance of less than 100 µm from the processed surface. This positioning of the quantum spin defect means that it is readily accessible for end applications such that it can be characterised and "read out", for example, by optical coupling to a waveguide.

The surface of the single crystal diamond host material may be processed either before or after the formation of a quantum spin defect therein. In this regard, the quantum spin defect, such as an NV centre, may be formed after preparation of the host material. Thus, in a further aspect, the present invention provides a method for preparing a solid state system comprising a host material and a quantum spin defect having a T2 at room temperature of about 300 µs or more, wherein the host material comprises single crystal diamond prepared by a chemical vapour deposition (CVD) process having a total nitrogen concentration of about 20 ppb or less comprising:

forming a quantum spin defect in the host material, wherein a surface of the host material has been processed such that the surface roughness, $R_q$ of the single crystal diamond within an area defined by a circle of radius of about 5 µm centred on the point on the surface nearest to where the quantum spin defect is formed is about 10 nm or less.

Alternatively, the quantum spin defect may be formed in the host material prior to processing of the surface. In this regard, the present invention further provides a method for preparing a solid state system comprising a host material and a quantum spin defect having a T2 at room temperature of about 300 µs or more, wherein the host material comprises a layer of single crystal CVD diamond having a total nitrogen concentration of about 20 ppb or less comprising:

processing a surface of a host material in which a quantum spin defect has been formed such that the surface roughness, $R_q$ of the single crystal diamond within an area defined by a circle of radius of about 5 µm centred on the point on the surface nearest to where the quantum spin defect is formed is about 10 nm or less.

Where a quantum spin defect is present in a host material, in the end application of the material, the quantum spin defect will need to be characterised and read out. In order for the system which comprises the host material and the defect to be useful for e.g. quantum computing applications, it is necessary that the frequency of the optical transition which is used to characterise and read out a quantum spin defect has a high spectral stability. This ensures that one quantum spin defect cannot be distinguished from any other quantum spin defect a condition necessary for quantum entanglement.

The spectral stability of a quantum spin defect, for example, an NV$^-$ centre is quantified by the spread of frequencies of the photons emitted by the centre over a time period, measured at room temperature (about 300 K). In the case of an NV centre, the photon that is measured is the photon that is emitted when an electron in the $m_s$=±1 excited state relaxes (i.e. de-excites) into the $m_s$=0 ground state. The photons associated with the zero phonon line (ZPL) have a nominal wavelength of 637 nm, corresponding to a frequency of approximately 4.7×10$^{14}$ Hz (470 THz). The photons of the ZPL are admitted to a spectrometer and their frequency determined. By measuring the frequency of a large number of photons, a histogram of number of photons having a particular frequency versus the frequency of the photon can be plotted. Surprisingly, in the solid state systems of the present invention, the quantum defect exhibits a particularly stable optical transition.

The present inventors have identified that single crystal diamond material having a high chemical purity is particularly useful in spintronic applications. Therefore, in a further aspect, the present invention relates to the use of single crystal CVD diamond having a total nitrogen concentration of about 20 ppb or less in a spintronic application.

The diamond material of this invention has very low impurity levels and very low associated point defect levels. In addition, it may have very low dislocation densities and strain, and vacancy and self-interstitial concentrations which are sufficiently close to the thermodynamic equilibrium values associated with the growth temperature, such that the optical absorption spectrum of the material is essentially that of a perfect natural isotopic abundance diamond lattice and, as such, cannot be further improved in material which is diamond.

The term "ppm" is used herein to refer to parts per million.

The term "ppb" is used herein to refer to parts per billion.

The term "high chemical purity" is used herein to describe single crystal diamond material which has a total nitrogen concentration of about 20 ppb or less, preferably about 10 ppb or less, preferably about 5 ppb or less, preferably about 2 ppb or less, preferably about 1 ppb or less, preferably about 0.5 ppb or less, preferably about 0.2 ppb or less, preferably about 0.1 ppb or less.

The term "quantum spin defect" is used herein to refer to a paramagnetic defect centre which has two or more magnetic spin states and when incorporated into a host material can be used as a qubit. Preferably the quantum spin defect is an NV centre.

The term "spintronic applications" is used herein to refer to applications which exploit the quantum spin states of electrons. Examples include quantum computing and quantum cryptography and magnetometry.

The term "room temperature" as used herein refers to a temperature of approximately 300 K.

The term "surface roughness, $R_a$" (sometimes referred to a "centre line average" or "c.l.a.") refers to the arithmetic mean of the absolute deviation of surface profile from the mean line measured by stylus profilometer, measured over a length of 0.08 mm, measured according to British Standard BS 1134 Part 1 and Part 2. The mathematical description of $R_a$ (from "Tribology", I. M. Hutchings, Pub. Edward Arnold (London), 1992, pages 8-9) is:

$$R_a = \frac{1}{L}\int_0^L |y(x)|dx$$

The "surface roughness, $R_q$" refers to the root mean square roughness (sometimes also called the "RMS roughness"). Where $R_q$ is referred to, it is typically measured either using stylus profilometer, measured over a length of 0.08 mm, measured according to British Standard BS 1134 Part 1 and Part 2, or using a scanning probe instrument, such as an atomic force microscope, over an area of a few μm by a few μm (e.g. 1 μm×1 μm or 2 μm×2 μm); in the case of an $R_q$ being referred to, the $R_q$ is measured using a stylus profilometer unless it is specifically stated that the $R_q$ is measured using a scanning probe instrument. The mathematical description of $R_q$ (from "Tribology", I. M. Hutchings, Pub. Edward Arnold (London), 1992, pages 8-9) is:

$$R_q = \sqrt{\frac{1}{L}\int_0^L y^2(x)dx}$$

For a surface with a Gaussian distribution of surface heights, $R_q=1.25R_a$ (from "Tribology", I. M. Hutchings, Pub. Edward Arnold (London), 1992, pages 8-9).

The solid state system of the present invention comprises a host material and a quantum spin defect. The host material comprises a layer of single crystal CVD diamond having a total nitrogen concentration of about 20 ppb or less.

The single crystal CVD diamond host material of the solid state system of the present invention is produced by a chemical vapour deposition (CVD) process. Methods of synthesising diamond material, including homoepitaxial single crystal CVD diamond, are now well established and have been described extensively in patent and other literature. Where diamond material is being deposited on a growth surface of a substrate, the method generally involves providing a source gas which is inputted into a synthesis apparatus. Inside the synthesis apparatus the source gas in the synthesis environment is dissociated into hydrogen or a halogen (e.g. F, Cl) in atomic form and C or carbon-containing radicals and other reactive species, e.g. $CH_x$, $CF_x$ wherein x can be 1 to 4. In addition, oxygen-containing sources may be present, as may sources for nitrogen and for boron. In many processes, inert gases such as helium, neon or argon are also present. Thus, a typical source gas will contain hydrocarbons $C_xH_y$, wherein x and y can each be 1 to 10, or halocarbons $C_xH_yHal_z$, wherein x and z can each be 1 to 10 and y can be 0 to 10, and optionally one or more of the following: $CO_x$, wherein x can be 0.5 to 2, $O_2$, $H_2$, $N_2$, $NH_3$, $B_2H_6$ and an inert gas. Each gas may be present in its natural isotopic ratio, or the relative isotopic ratios may be artificially controlled. For example, hydrogen may be present as deuterium or tritium and carbon may be present as $^{12}C$ or $^{13}C$.

As a consequence of its production by a CVD process, the layer of single crystal diamond used as a host material in the solid state system of the present invention has a total chemical impurity concentration, excluding hydrogen and its isotopes, of about 1 ppm or less, alternatively about 0.1 ppm or less, alternatively about 0.01 ppm or less, alternatively about 0.003 ppm or less, alternatively about 0.001 ppm or less.

The preferred thickness of the layer of single crystal diamond material will depend upon the end application for which the solid state system comprising the layer of diamond material is to be used. For example, the thickness of the single crystal diamond layer may be 100 μm or less, alternatively about 50 μm or less, alternatively about 20 μm or less, alternatively about 10 μm or less. This is advantageous where the diamond layer is intended to be used in combination with a conventional diamond support layer. For ease of handling, the layer of diamond material may have a thickness of at least 0.1 μm or more, preferably about 0.2 μm or more, preferably about 0.5 μm or more.

Alternatively, the thickness of the layer of synthetic diamond material may be 100 μm or more, in some cases, 200 μm or more. The thickness of the layer of synthetic diamond material is less than about 2000 μm, alternatively less than about 1000 μm. Advantageously, where the layer has such a thickness, it is sufficiently thick to be mechanically robust and can be detached from the substrate to provide a free-standing layer of synthetic diamond material. It is preferred not to make the layer of synthetic diamond too thick as this adds considerably to the cost and difficulty of making the layer, in particular, as discussed previously, the surface roughness, $R_a$ or $R_q$, tends to increase as the thickness increases.

The present inventors have recognised that where single crystal diamond is to be used as a host material for a quantum spin defect, it is desirable to maximise the chemical purity of the diamond to minimise the presence of lattice defects and species which may have detrimental effect on the quantum spin defects. In order to maximise the chemical purity of the layer of synthetic diamond material, it is desirable to minimise the total concentration of nitrogen in the layer of synthetic diamond material. In this regard, the total concentration of nitrogen is about 20 ppb or less, preferably about 10 ppb or less, preferably about 5 ppb or less, preferably about 2 ppb or less, preferably about 1 ppb or less, preferably about 0.5 ppb or less, preferably about 0.2 ppb or less, preferably about 0.1 ppb or less.

Total nitrogen in diamond material can be measured by secondary ion mass spectrometry (SIMS). SIMS is a very sensitive technique which can be used to perform elemental analysis of thin layers, typically in the range of a few nm to a few μm. In this technique, the surface is sputtered by a primary ion beam and the portion of sputtered material that leaves the surface as ions is analysed by mass spectrometry. By comparing the count rate of a particular species to a standard concentration and by determining the depth of the sputter hole, a profile of depth versus concentration can be generated. A set of values can be taken in a given area and then averaged.

Nitrogen present as single substitutional nitrogen can be measured by electron paramagnetic resonance (EPR). The lower limit of sensitivity is less than about 1 ppb (less than about $2\times10^{14}$ cm$^{-3}$). The vast majority of nitrogen in CVD diamond is present as single substitutional nitrogen. In this regard, single substitutional nitrogen typically accounts for about 99% or more of nitrogen present in CVD diamond.

Nitrogen present as NV centres has been correlated with the W15 EPR centre and can be measured by EPR down to concentrations of about 1 ppb (about $2\times10^{14}$ cm$^{-3}$). Confocal photoluminescence (confocal PL) can identify individual NV centres and so extremely low concentrations can be measured by counting procedures. The inventors have found that typically the concentration of NV centres is between about $1/10$ and about $1/100$, more typically between about $1/20$ and about $1/50$, more typically about $1/30$, of the total N concentration in CVD diamond, when the total nitrogen concentration is about 100 ppb. It is believed that it is reasonable to extrapolate this ratio to lower NV concentrations.

The present inventors have identified that it is also desirable to minimise the presence of other impurities in the layer of single crystal diamond material. In this regard, the layer of single crystal CVD diamond preferably satisfies one or more of the following criteria:

(i) the concentration of boron is about 100 ppb or less, preferably about 50 ppb or less, preferably about 20 ppb or less, preferably about 10 ppb or less, preferably about 5 ppb or less, preferably about 2 ppb or less, preferably about 1 ppb or less, preferably about 0.5 ppb or less, preferably about 0.2 ppb or less, preferably about 0.1 ppb or less;

(ii) the concentration of uncompensated substitutional boron is about 100 ppb or less, preferably about 50 ppb or less, preferably about 20 ppb or less, preferably about 10 ppb or less, preferably about 5 ppb or less, preferably about 2 ppb or less, preferably about 1 ppb or less, preferably about 0.5 ppb or less, preferably about 0.2 ppb or less, preferably about 0.1 ppb or less;

(iii) the concentration of silicon is about 100 ppb or less, preferably about 50 ppb or less, preferably about 20 ppb or less, preferably about 10 ppb or less, preferably about 5 ppb or less, preferably about 2 ppb or less, preferably about 1 ppb or less, preferably about 0.5 ppb or less, preferably about 0.2 ppb or less, preferably about 0.1 ppb or less, preferably about 0.05 ppb or less;

(iv) the concentration of the silicon-vacancy (referred to as "SiV"), characterised by the intensity of the 737 nm photoluminescence (PL) line normalised against the intensity of the diamond Raman line at a shift of about 1332.5 $cm^{-1}$, both measured at a temperature of about 77 K, is about 0.5 or less, preferably about 0.2 or less, preferably about 0.1 or less, preferably about 0.05 or less, preferably about 0.02 or less, preferably about 0.01 or less, preferably about 0.005 or less;

(v) the concentration of intrinsic paramagnetic defects i.e. defects which have a non-zero spin magnetic spin, $X^{-/+}$ is about 1 ppm or less, preferably about 0.5 ppm or less, preferably about 0.2 ppm or less, preferably about 0.1 ppm or less, preferably about 0.05 ppm or less, preferably about 0.02 ppm or less, preferably about 0.01 ppm or less, preferably about 0.005 ppm or less, preferably about 0.001 ppm or less;

(vi) the concentration of any single non-hydrogen impurity is about 5 ppm or less. Preferably the level of any single impurity excluding hydrogen and its isotopes is about 1 ppm or less, preferably about 0.5 ppm or less.

(vii) The total impurity content excluding hydrogen and its isotopes is about 10 ppm or less. Preferably, the total impurity content excluding hydrogen and its isotopes is about 5 ppm or less, preferably about 2 ppm or less; and (viii) the concentration of hydrogen impurities (specifically hydrogen and its isotopes) is about $10^{18}$ $cm^{-3}$ or less, preferably about $10^{17}$ $cm^{-3}$ or less, preferably about $10^{16}$ $cm^{-3}$ or less, preferably about $10^{15}$ $cm^{-3}$ or less.

The single crystal CVD diamond may satisfy any of features (i) to (viii) in any number and in any combination. In one embodiment, the single crystal CVD diamond may satisfy two of features (i) to (viii) in any combination. In an alternative embodiment, the single crystal CVD diamond may satisfy three of features (i) to (viii) in any combination. In an alternative embodiment, the single crystal CVD diamond may satisfy four of features (i) to (viii) in any combination. In an alternative embodiment, the single crystal CVD diamond may satisfy five of features (i) to (viii) in any combination. In an alternative embodiment, the single crystal CVD diamond may satisfy six of features (i) to (viii) in any combination. In an alternative embodiment, the single crystal CVD diamond may satisfy seven of features (i) to (viii) in any combination. In an alternative embodiment, the single crystal CVD diamond may satisfy all eight of features (i) to (viii).

The concentration of boron and the concentration of silicon may be determined using SIMS.

The concentration of uncompensated substitutional boron may be measured using a capacitance-voltage (CV) technique.

The concentration of the silicon-vacancy, Si-V, may be characterised by the intensity of the 737 nm photoluminescence (PL) line normalised against the intensity of the diamond Raman line at a shift of about 1332.5 $cm^{-1}$, both measured at a temperature of about 77 K.

The concentration of paramagnetic defects may be determined using EPR techniques.

An intrinsic paramagnetic defect is a lattice defect having a non-zero spin which is intrinsic to the material such as dislocations and vacancy clusters. The concentration of such defects can be determined using electron paramagnetic resonance (EPR) at g=2.0028. This line is believed to be related to the presence of lattice defects.

Impurity concentrations can be measured by secondary ion mass spectroscopy (SIMS), glow discharge mass spectroscopy (GDMS), combustion mass spectroscopy (CMS), electron paramagnetic resonance (EPR) and infrared (IR) absorption, and in addition for single substitutional nitrogen by optical absorption measurements at 270 nm (calibrated against standard values obtained from samples destructively analysed by combustion analysis). In the above, "impurity" excludes hydrogen and its isotopic forms.

An example of single crystal CVD diamond material which is suitable as a host material in the solid state system of the present invention is that described in WO01/96333.

More specifically, the layer of single crystal diamond material may have at least one of a number of electronic characteristics.

In this regard, the layer of single crystal CVD diamond of the solid state system of the present invention may have, in the off state, a resistivity $R_1$ of about $1 \times 10^{12}$ Ω·cm or more, preferably about $2 \times 10^{13}$ Ω·cm or more, preferably about $5 \times 10^{14}$ Ω·cm or more, all measured at an applied field of 50 V/μm and 300 K (or 20° C., which for the purposes of this invention is considered equivalent). Such resistivities at such high applied fields are indicative of the chemical purity of the diamond and the substantial absence of impurities and defects. Material of lower chemical purity or crystal perfection can exhibit high resistivity at lower applied fields, e.g. less than 30 V/μm, but shows breakdown behaviour with rapidly rising leakage currents at applied fields greater than 30 V/μm and generally by 45 V/μm. The resistivity can be determined from a measurement of the leakage (dark) current by methods known in the art. A sample under test is prepared as a plate of uniform thickness, cleaned using standard diamond cleaning techniques in order to accept suitable contacts (evaporated, sputtered or doped diamond) to which external connections can be made to the voltage supply, and then partially or wholly encapsulated to avoid risk of flash-over. It is important to ensure that the encapsulation does not add significantly to the leakage current measured. Typical sample sizes are 0.01-0.5 mm thick by 3×3 mm-50×50 mm laterally, but smaller or larger sizes may also be used.

Alternatively or in addition, the layer of single crystal CVD diamond of the solid state system of the present invention may have a high current with long carrier life time in the on state and, more particularly, a $\mu\tau$ product of about $1.5 \times 10^{-6}$ cm$^2$/V or more, preferably greater than about $4.0 \times 10^{-6}$ cm$^2$/V or more, preferably about $6.0 \times 10^{-6}$ cm$^2$/V or more, all measured at an applied field of about 50 V/$\mu$m and a temperature of about 300 K. $\mu$ is the mobility and $\tau$ is the lifetime of the charge carriers, the product representing the contribution by a charge carrier to the total charge displacement or current. This characteristic can also be measured and expressed as a charge collection distance.

The $\mu\tau$ product is related to the charge collection distance using the following equation:

$$\mu\tau E = CCD$$

$$(cm^2/Vs) \times (s) \times (V/cm) = cm$$

where E=applied field

The layer of single crystal CVD diamond of solid state system of the invention, particularly in its preferred form, may have a high $\mu\tau$ product which translates into a high charge collection distance, much higher than has been achieved with any other known single crystal CVD diamond.

When an electric field is applied to a sample using electrodes it is possible to separate the electron-hole pairs generated by photon irradiation of the sample. The holes drift toward the cathode and the electrons toward the anode. Light with a short wavelength (ultraviolet or UV light) and a photon energy above the band gap of the diamond has a very small penetration depth into diamond and by using this type of light it is possible to identify the contribution of one type of carrier only dependent on which electrode is illuminated.

The $\mu\tau$ product referred to in this specification is measured in the following way:

(i) A sample of diamond is prepared as a plate in excess of $\approx$100 $\mu$m thick.

(ii) Ti semi-transparent contacts are sputtered onto both sides of the diamond plate and then patterned using standard photolithography techniques. This process forms suitable contacts.

(iii) A 10 $\mu$s pulse of monochromatic Xe light (wavelength 218 nm) is used to excite carriers, with the photocurrent generated being measured in an external circuit. The pulse length of 10 $\mu$s is far longer than other processes such as the transit time and the carrier lifetime and the system can be considered to be in equilibrium at all times during the pulse. The penetration of light into the diamond at this wavelength is only a few microns. Relatively low light intensity is used (about 0.1 W/cm$^2$), so that $N_0$ is relatively low and the internal field is then reasonably approximated by the applied field. The applied field is kept below the threshold above which mobility becomes field dependent. The applied field is also kept below the value above which a significant proportion of the charge carriers reach the far side of the diamond and the total charge collected shows saturation (with blocking contacts; non-blocking contacts can show gain at this point).

(iv) The $\mu\tau$ product is derived by relating the collected charge to the applied voltage using the Hecht relation.

$$Q = N_0 e \mu\tau E/D \{1 - \exp\{-D/(\mu\tau E)\}\}$$

In this equation Q is the charge collected at the non-illuminated contact, $N_0$ the total number of electron hole pairs generated by the light pulse, E the applied electric field, D the sample thickness, and $\mu\tau$ is the mobility and lifetime product to be determined.

(v) As an example, if the illuminated electrode is the anode (cathode), then the charge carriers are generated within a few $\mu$m of the surface, and the charge displacement of the electrons (holes) to the nearby electrode is negligible. In contrast, the charge displacement of the holes (electrons) towards the opposing contact is significant, and limited by the $\mu\tau$ product, where both $\mu$ and $\tau$ are specific to the particular charge carriers moving towards the non-irradiated electrode.

Alternatively or in addition, the layer of single crystal CVD diamond of the solid state system of the present invention may have an electron mobility ($\mu_e$) measured at 300 K of about 2400 cm$^2$V$^{-1}$s$^{-1}$ or more, preferably about 3000 cm$^2$V$^{-1}$s$^{-1}$ or more, preferably about 4000 cm$^2$V$^{-1}$s$^{-1}$ or more. In high quality type IIa natural diamond electron mobilities, at 300 K, are reported to be typically 1800 cm$^2$V$^{-1}$s$^{-1}$ with exceptional values reported up to 2200 cm$^2$V$^{-1}$s$^{-1}$.

Alternatively or in addition, the layer of single crystal CVD diamond of the solid state system of the present invention may have a hole mobility ($\mu_h$) measured at 300 K of about 2100 cm$^2$V$^{-1}$s$^{-1}$ or more, preferably about 2500 cm$^2$V$^{-1}$s$^{-1}$ or more, preferably about 3000 cm$^2$V$^{-1}$s$^{-1}$ or more. In high quality type IIa natural diamond, hole mobilities at 300 K are reported to be typically 1200 cm$^2$V$^{-1}$s$^{-1}$ with exceptional values reported up to 1900 cm$^2$V$^{-1}$s$^{-1}$.

Alternatively or in addition, the layer of single crystal CVD diamond of the solid state system of the present invention may have a high charge collection distance of about 150 $\mu$m or more, preferably about 400 $\mu$m or more, preferably about 600 $\mu$m or more, all collection distances being measured at an applied field of 1 V/$\mu$m and 300 K. In high quality type IIa natural diamond, charge collection distances are reported to be substantially less than 100 $\mu$m, and more typically about 40 $\mu$m at 300 K and an applied field of 1 V/$\mu$m.

Collection distance and its determination are known in the art. Radiation such as UV, X-rays and gamma rays impinging on diamond can form electron hole pairs which drift under an applied voltage between electrodes. Typically, for penetrating radiation such as beta and gamma rays the electrodes are placed on opposite surfaces of a diamond layer whose thickness is typically 200-700 $\mu$m but can range from less than 100 $\mu$m to greater than 1000 $\mu$m and the charge carriers (electrons/holes) drift through the thickness of the layer. For highly absorbed radiation which penetrates only a few $\mu$m into the diamond, such as alpha radiation or UV radiation with energies near or above that of the band gap, then inter-digitated electrode arrangements on the same face of the diamond layer may be used; this face may be planar or with the electrodes placed in relationship to surface structures such as grooves.

However, the electrons and holes have finite mobilities and lifetimes so they move only a certain distance before recombining. When an event occurs (e.g. impingement of a beta particle) which forms charge carriers, then to first order the total signal from the detector depends on the average distance moved by the charge carriers. This charge displacement is a product of the carrier mobility and the applied electric field (which gives the charge drift velocity) and the recombination lifetime of the carriers before trapping or recombination stops its drift. This is the collection distance, which can also be considered as the volume of charge swept to the electrode. The more pure the diamond (or the lower the level of uncompensated traps) or the lower the level of crystalline imperfections, then the higher the mobility of the carriers and/or their lifetimes. The collection distance measured is generally limited by the thickness of the sample under test; if the collection distance measurement exceeds about 80% of the sample thickness, then the measured value is likely to be a lower limit rather than the actual value.

The collection distances referred to herein were determined by the following procedure:

1) Ohmic spot contacts are placed on either side of the layer under test. This layer is typically 300-700 µm thick and 5-10 mm square, allowing spot contacts of 2-6 mm diameter. Formation of ohmic contacts (rather than contacts showing diode behaviour) is important for a reliable measurement. This can be achieved in several ways but typically the procedure is as follows:
    i) the surface of the diamond is oxygen terminated, using for example, an oxygen plasma ash, minimising the surface electrical conduction (reducing the 'dark current' of the device);
    ii) a metallisation consisting of first a carbide former (e.g. Ti, Cr) and then a thicker layer of protective material, typically Au (to which a wire bond can be made), is deposited onto the diamond by sputtering, evaporation or similar method. The contact is then typically annealed between about 400° C. and about 600° C. for up to about an hour.
2) Wire bonds to the contacts are made, and the diamond connected in a circuit, with a bias voltage of typically 2-10 kV/cm. The 'dark current' or leakage current is characterised, and in a good sample should be less than about 5 nA, and more typically less than about 100 pA at 2.5 kV/cm, using 3 mm diameter spot contacts.
3) The collection distance measurement is made by exposing the sample to beta radiation, with a Si trigger detector on the exit face to a) indicate that an event has occurred, and b) ensure that the beta particle was not stopped within the diamond film which would result in a much larger number of charge carriers being formed. The signal from the diamond is then read by a high gain charge amplifier, and, based on the known formation rate of charge carriers of about 36 electron/hole pairs per linear µm traversed by the beta particle, the collection distance can be calculated from the charge measured by the equation:

$CCD = CCE \times t$ where t=sample thickness
    CCE=charge collection efficiency=charge collected/total charge generated.
    CCD=charge collection distance.
4) For completeness, the collection distance is measured for a range of values of applied bias voltage, both forward and reverse, and the characteristic collection distance quoted at bias voltages of 10 kV/cm only for samples which show a well behaved linear behaviour for bias voltages up to 10 kV/cm bias. In addition, the entire measurement procedure is repeated several times to ensure repeatability of behaviour, as values measured on poorer samples can degrade with time and treatment history.
5) A further issue in measurement of the collection distance is whether the material is in the pumped or unpumped state. 'Pumping' (also called 'priming') the material comprises of exposing it to certain types of radiation (beta, gamma etc.) for a sufficient period, when the collection distance measured can rise, typically by a factor of 1.6 in polycrystalline CVD diamond although this can vary. The effect of priming is generally lower in high purity single crystal; priming by factors of 1.05-1.2 is common with no measurable priming in some samples. De-pumping can be achieved by exposing to sufficiently strong white light or light of selected wavelengths, and the process is believed to be wholly reversible. The collection distances referred to in this specification are all in the unpumped state whatever the final application of the material. In certain applications (e.g. high energy particle physics experiments), the increase in collection distance associated with pumping can be used beneficially to enhance the detectability of individual events, by shielding the detector from any de-pumping radiation. In other applications, the instability in device gain associated with pumping is severely deleterious.

The characteristics described above are observable in the majority volume of the diamond. There may be portions of the volume, generally less than 10 percent by volume, where the particular characteristic is not observable. In this regard, the term "majority volume" is used herein to refer to a single volume which is continuous and contains no regions which do not fulfil the specified criterion.

In addition to the characteristics described above, the layer of single crystal CVD diamond used as the host material in the solid state system of the present invention may have a cathodoluminescence (CL) emission signal in the 575 nm band which is low or absent, and an associated photoluminescence (PL) line, measured at 77 K under 514 nm Ar ion laser excitation (nominally 300 mW incident beam) which has a peak height<$\frac{1}{1000}$ of the diamond Raman peak at 1332 cm$^{-1}$. These bands are related to nitrogen/vacancy defects and their presence indicates the presence of nitrogen in the film. Due to the possible presence of competing quenching mechanisms, the normalised intensity of the 575 nm line is not a quantitative measure of nitrogen nor is its absence a definitive indication of the absence of nitrogen in the film. CL is the luminescence resulting from excitation by electron beam at a typical beam energy of 10 to 40 keV which penetrates about 30 nm to 10 microns into the sample surface. Photoluminescence is more generally excited through the sample volume.

Alternatively or in addition, the layer of single crystal CVD diamond of the solid state system of the present invention may have a uniform strong free exciton (FE) peak at 235 nm in the CL spectrum collected at 77 K. The presence of a strong free exciton peak indicates the substantial absence of defects such as dislocations and impurities. The link between low defect and impurity densities and high FE has been previously reported for individual crystals in polycrystalline CVD diamond synthesis.

Alternatively or in addition, the layer of single crystal CVD diamond of the solid state system of the present invention may have strong free exciton emission in the room temperature UV-excited photoluminescence spectrum. Free exciton emission can also be excited by above-band gap radiation, for example by 193 nm radiation from an ArF excimer laser. The presence of strong free exciton emission in the photoluminescence spectrum excited in this way indicates the substantial absence of dislocations and impurities. The strength of free exciton emission excited by 193 nm ArF excimer laser at room temperature is such that the quantum yield for free exciton emission is at least 10$^{-5}$.

Alternatively or in addition, the layer of single crystal CVD diamond of the solid state system of the present invention may have, in electron paramagnetic resonance (EPR), a single substitutional nitrogen centre [N—C]$^0$ at a concentration of about 40 ppb or less and more typically about 10 ppb or less, indicating low levels of nitrogen incorporation.

Alternatively or in addition, the layer of single crystal CVD diamond of the solid state system of the present invention may have, in EPR, a spin density of about $1\times10^{17}$ cm$^{-3}$ or less and more typically about $5\times10^{16}$ cm$^{-3}$ or less, more typically about $2\times10^{16}$ cm$^{-3}$ or less, more typically about $1\times10^{16}$ cm$^{-3}$ or less, more typically about $5\times10^{15}$ cm$^{-3}$ or less, more typically about $2\times10^{15}$ cm$^{-3}$ or less at g=2.0028. In single crystal diamond this line at g=2.0028 is related to lattice defect concentrations and is typically large in natural type IIa diamond, in CVD diamond plastically deformed through indentation, and in poor quality homoepitaxial diamond.

Alternatively or in addition, the layer of single crystal CVD diamond of the solid state system of the present invention may have excellent optical properties having a UV/Visible and IR (infrared) transparency close to the theoretical maximum for diamond and, more particularly, low or absent single substitutional nitrogen absorption at 270 nm in the UV, and low or absent C—H stretch bonds in the spectral range 2500 to 3400 cm$^{-1}$ wavenumbers in the IR.

The layer of single crystal CVD diamond of the solid state system of the present invention may be attached to a diamond substrate (whether the substrate is synthetic, natural, or CVD diamond). This is advantageous as it mean that a greater overall thickness may be provided where the thickness limits the application or providing support for a CVD diamond whose thickness has been reduced by processing. In addition, the layer of single crystal CVD diamond may form one layer in a multilayer device, where other diamond layers may, for example, be doped to provide electrical contact or electronic junctions to the CVD diamond, or merely be present to provide support to the CVD diamond.

In one embodiment, layers of single crystal CVD diamond suitable for use in the solid state systems of the present invention and/or for use in spintronic applications may be produced by a method which includes the steps of providing a diamond substrate having a surface which is substantially free of crystal defects, providing a source gas, dissociating the source gas and allowing homoepitaxial diamond growth on the surface which is substantially free of crystal defects in an atmosphere which contains less than 300 parts per billion nitrogen.

The substrate used for producing the layer of single crystal CVD diamond of the host material of the present invention is preferably a diamond substrate, preferably a diamond substrate that is suitable for use in homoepitaxial diamond synthesis. The substrate of the present invention may be a low birefringence type Ia or IIb natural diamond or a low birefringence type Ib or IIa high pressure/high temperature (HPHT) synthetic diamond. The substrate may comprise a HPHT synthetic diamond layer on which a CVD diamond substrate layer has been synthesised, such that preferably the growth surface of the substrate is a surface of the CVD diamond substrate layer. Alternatively, the substrate of the present invention may be a single crystal CVD diamond. The substrate may be a homoepitaxial single crystal CVD diamond produced by homoepitaxial single crystal CVD diamond synthesis (also known herein as a homoepitaxial substrate).

Preferably the diamond substrate has a low birefringence. In this regard, it is preferred that the substrate satisfies at least one of the following:
a) a density of extended defects as characterised by X-ray topography of about 1000 per cm$^2$ or less over an area of about 0.014 cm$^2$ or more;
b) an optical isotropy of about $1\times10^{-4}$ or less over a volume of about 0.1 mm$^3$ or greater; and
c) a FWHM ("Full Width at Half Maximum") X-ray rocking curve width for the (004) reflection of about 120 arc seconds or less.

As used herein, the term "extended defects" refers to defects such as dislocations or dislocation bundles and stacking faults.

The diamond substrate of the present invention may have at least two, preferably at least three of the criteria (a) to (c). Preferably the layer of synthetic diamond material meets the criteria (a) and (b), or criteria (a) and (c), or criteria (b) and (c), more preferably (a), (b) and (c).

Preferably, the diamond substrate has a density of extended defects as characterised by X-ray topography of about 1000 per cm$^2$ or less, preferably about 400 per cm$^2$ or less, preferably about 300 per cm$^2$ or less, preferably about 200 per cm$^2$ or less, preferably about 100 per cm$^2$ or less. Preferably, the area over which the extended defect are characterised is about 0.014 cm$^2$ or more, preferably about 0.1 cm$^2$ or more, preferably about 0.25 cm$^2$ or more, preferably about 0.5 cm$^2$ or more, preferably about 1 cm$^2$ or more, preferably about 2 cm$^2$ or more.

Preferably, the diamond substrate has an optical isotropy of about $1\times10^{-4}$ or less, preferably about $5\times10^{-5}$ or less, preferably about $1\times10^{-5}$ or less, preferably about $5\times10^{-6}$ or less, preferably about $2\times10^{-6}$ or less, preferably about $1\times10^{-6}$ or less. Preferably this optical isotropy is measured over a volume of about 0.1 mm$^3$ or more, preferably about 0.5 mm$^3$ or more, preferably about 1 mm$^3$ or more, preferably about 3.4 mm$^3$ or more, preferably about 8 mm$^3$ or more, preferably about 27 mm$^3$ or more, preferably about 64 mm$^3$ or more, preferably about 125 mm$^3$ or more, preferably about 512 mm$^3$ or more, preferably about 1000 mm$^3$ or more.

Preferably, the diamond substrate has a (004) X-ray rocking curve with a full width half maximum (FWHM) of about 120 arc seconds or less, preferably about 50 arc seconds or less, preferably 20 arc seconds or less, preferably about 10 arc seconds or less, preferably about 7 arc seconds or less, preferably about 5 arc seconds or less, preferably about 3 arc seconds or less, preferably about 2 arc seconds or less, preferably about 1.5 arc seconds or less. Preferably the (004) X-ray rocking curve FWHM is measured over an area of about 1 mm×1 mm or greater, preferably about 2 mm×2 mm or greater, preferably about 4 mm×4 mm or greater, preferably about 7 mm×7 mm or greater, preferably about 15 mm×15 mm or greater.

Preferably, the diamond substrate has an extremely low level of birefringence. In diamond, birefringence is typically associated with the presence of large numbers of extended defects (e.g. dislocations, dislocation bundles and stacking faults) that cause high levels of localised strain and consequently birefringence. Preferably the maximum birefringence evaluated by measurements through the thickness of the substrate over about 70% or more of the area of the major surface, preferably about 80% or more of the area of the major surface, preferably about 90% or more of the area of the major surface, preferably about 95% or more of the area of the major surface, preferably about 98% or more of the area of the major surface, is $1\times10^{-4}$ or less, preferably $5\times10^{-5}$ or less, preferably $1\times10^{-5}$ or less, preferably $5\times10^{-6}$ or less, preferably $1\times10^{-6}$ or less. The birefringence can be evaluated using an instrument such "Metripol" (Oxford Cyrosystems Ltd., Oxford, UK). It is advantageous to use diamond material of such low birefringence as this reduces the number per unit area of extended defects propagating from the substrate into the homoepitaxial diamond layer during the growth of the homoepitaxial diamond layer; such defects may be "decorated" with impurity atoms that can have non-zero nuclear spin and therefore can reduce the T2 time of nearby quantum spin defects.

Preferably, the nitrogen concentration within the diamond substrate is about 200 ppm or less, preferably about 150 ppm or less, preferably about 100 ppm or less, preferably about 50 ppm or less, preferably about 20 ppm or less, preferably about 10 ppm or less, preferably about 5 ppm or less, preferably about 2 ppm or less, preferably about 1 ppm or less, preferably about 0.5 ppm or less, preferably about 0.1 ppm or less, preferably about 0.01 ppm or less, preferably about 0.001 ppm or less, as determined by SIMS measurements or EPR measurements. A low nitrogen concentration in the diamond substrate is advantageous because it reduces the strain associated with the lattice expansion of diamond with a higher concentration of nitrogen impurities and with any interface dislocations which may be generated to take up the lattice mismatch at the interface between the substrate and the diamond material. It has the further advantage of increasing T2 for quantum spin defects that are less than about 100 μm from the interface between the substrate and the CVD diamond layer.

After synthesis, the substrate may be retained to act as a supporting layer to the diamond material. Alternatively, the substrate may be removed from the diamond material after synthesis and discarded leaving the diamond material as a freestanding object. The diamond material may contain one or more further layers, termed hereinafter "intermediate support layers". Therefore, in one embodiment, the diamond material of the present invention may comprise a layer of higher chemical purity layer than the substrate to remove the effect of impurity related spin centres in the attached substrate, followed by a layer with high chemical purity that contains the quantum spin defect (e.g. the NV centre). Alternatively, the diamond material may be separated from the substrate, which is discarded, leaving a diamond material comprising a diamond layer and one or more intermediate support layers.

Where the substrate is a diamond substrate, the surface of the substrate upon which diamond growth takes place may be substantially a {100}, {110} or {111} surface. These surfaces are advantageous for the growth surface of the substrate because each of these surfaces has a low index which means that there are a minimal number of step edges in the surface.

Where the substrate is a diamond substrate, it preferably has a (001) major face, which may be bounded by edges lying substantially along the <100> directions. It is further preferred that the substrate has a major surface with a normal that is divergent from the [001] direction by about 10° or less, preferably about 5° or less, preferably about 4° or less, preferably about 3° or less, preferably about 2° or less, preferably about 1° or less. It is further preferred that the substrate has a major surface with a normal that is divergent from the [001] direction by about 0.01° or more, preferably about 0.05° or more, preferably about 0.2° or more, preferably about 0.5° or more. Alternatively, it is preferred that the substrate has a major surface with a normal that is divergent from the [001] direction by between about 0.01° and about 2°, preferably between about 0.05° and about 1.5°, preferably between about 0.5° and about 1°. A small but non-zero divergence may assist in obtaining growth of high quality by providing a low but uniform density of step edges. Where the edges of the substrate are substantially aligned along <100> directions, it is preferred that the edges of the substrate are within about 10° of <100> directions, preferably within about 5° of <100> directions, within about 3° of <100> directions.

As used herein, the term "substantially" when referring to a direction, e.g. a crystallographic direction or a direction with respect to the growth surface of the substrate, means within about 10° of said direction, alternatively within about 5° of said direction, alternatively within about 4° of said direction, alternatively within about 3° of said direction.

The surface of the substrate upon which growth takes place is substantially free of crystal defects. The term "crystal defects" is used hereinafter to refer to extended and/or structural crystal defects, such as dislocations, stacking faults, twin boundaries, etc. that are intrinsic to the material.

As used herein, "substantially free of crystal defects" when referring to the growth surface of the substrate refers to a density of crystal defects on the growth surface of about $5 \times 10^3$ mm$^{-2}$ or less, preferably about $1 \times 10^2$ mm$^{-2}$ or less as determined by a revealing plasma etch as described below.

It is advantageous to use a substrate with a growth surface that is substantially free of crystal defects since the concentration of crystal defects in a synthetic diamond material is increased if the growth surface of the substrate upon which the diamond material is synthesised contains a high number of crystal defects. A reduced concentration of crystal defects in the synthetic diamond material is advantageous for spintronic applications since this reduction reduces the concentration of paramagnetic defects and increases the T2 of the qubit defect centres in the diamond layer. Crystal defects can result in the presence of strain in the material which in turn can affect the optical characteristics of the quantum spin defect; therefore reducing the density of crystal defects is advantageous.

The defect density is most easily characterised by optical evaluation after using a plasma or chemical etch optimised to reveal the defects (referred to as a revealing plasma etch), using for example a brief plasma etch of the type described below. Two types of defects can be revealed:

1) Those intrinsic to the substrate material quality. In selected natural diamond the density of these defects can be as low as 50/mm$^2$ with more typical values being 10$^2$/mm$^2$, whilst in others it can be 10$^6$/mm$^2$ or greater.
2) Those resulting from polishing, including dislocation structures and microcracks in the form of 'chatter tracks' along polishing lines. The density of these can vary considerably over a sample, with typical values ranging from about 10$^2$/mm$^2$, up to more than 10$^4$/mm$^2$ in poorly polished regions or samples.

The preferred low density of defects is thus such that the density of surface etch features related to defects, as described above, is below $5 \times 10^3$/mm$^2$, and more preferably below 10$^2$/mm$^2$.

One type of revealing etch which may be used is a plasma etch using predominantly hydrogen with optionally a small amount of Ar and a required small amount of $O_2$. Typical oxygen etch conditions are pressures of between about $50 \times 10^2$ Pa and about $450 \times 10^2$ Pa, an etching gas containing an oxygen content of between about 1% and about 5%, an argon content of between 0% and about 30% and the balance hydrogen, all percentages being by volume, with a substrate temperature of between about 600° C. and about 1100° C. (more typically about 800° C.) and a typical duration of about 3 to about 60 minutes. The etched surface is then examined using an optical microscope and the number of surface features is counted.

The defect level at and below the substrate surface on which the CVD growth takes place may thus be minimised by careful preparation of the substrate. Here preparation includes any process applied to the material from mine recovery (in the case of natural diamond) or synthesis (in the case of synthetic material) as each stage can influence the defect density within the material at the plane which will ultimately form the substrate surface when processing to form a substrate is complete. Particular processing steps may include conventional diamond processes such as mechanical sawing, lapping and polishing, and less conventional techniques such as laser processing or ion implantation and lift off techniques, chemical/mechanical polishing, and both liquid and plasma chemical processing techniques.

Advantageously, the surface $R_a$ of the substrate should be minimised. Preferably, the $R_a$ of the growth surface of the substrate prior to any plasma etch is about 10 nm or less, preferably about 5 nm or less, preferably about 2 nm or less, preferably about 1 nm or less, preferably about 0.5 nm or less, preferably about 0.2 nm or less.

The required $R_a$ and/or crystallographic orientation of the substrate may be achieved by mechanically sawing or laser sawing the substrate from a larger piece of diamond material of high perfection, preferably from a single growth sector of such a piece of diamond material. The major surfaces of the substrate may they be processed using conventional lapidary techniques such as lapping and scaif polishing. Such techniques are well-known in the art, and are referred to herein as "mechanical processing". Preferably, the growth surface of the substrate is scaif polished.

A mechanically processed substrate may have a mechanically damaged layer (also referred to as a "subsurface damage layer") that extends beneath the surface from a depth of a few micrometers up to several tens of micrometers, depending upon the precise details of the mechanical processing.

One specific method which can be used to reduce the effect of the mechanically damaged layer of the substrate on the subsequent growth of a single crystal CVD diamond layer is the use of an in situ plasma etch. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of:

(i) an oxygen etch using predominantly hydrogen with optionally a small amount of Ar and a required small amount of $O_2$. Typical oxygen etch conditions are pressures of $50-450 \times 10^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.

(ii) a hydrogen etch which is similar to (i) but where the oxygen is absent.

(iii) alternative methods for the etch not solely based on argon, hydrogen and oxygen may be used, for example, those utilising halogens, other inert gases or nitrogen.

Typically the etch consists of an oxygen etch followed by a hydrogen etch and then the process moves directly into synthesis by the introduction of the carbon source gas. The etch time/temperature is selected to enable any remaining surface damage from processing to be removed, and for any surface contaminants to be removed, but without forming a highly roughened surface and without etching extensively along extended defects (such as dislocations) which intersect the surface and thus cause deep pits. As the etch is aggressive, it is particularly important for this stage that the chamber design and material selection for its components be such that no material from the chamber is transferred by the plasma into the gas phase or to the substrate surface. The hydrogen etch following the oxygen etch is less specific to crystal defects rounding off the angularities caused by the oxygen etch (which aggressively attacks such defects) and provides a smoother, better surface for subsequent growth.

Alternatively, the pre-growth in situ plasma etch of a surface of the substrate may be replaced or preceded by an ex situ isotropic etch such as an $Ar—Cl_2$ inductively coupled plasma etch, such as that described in the co-pending application PCT/IB2008/050215. An $Ar—Cl_2$ inductively coupled plasma etch may also be used to prepare the surface of the substrate upon which the CVD diamond layer that will ultimately contain the quantum defect centres. It is advantageous to precede the in situ plasma etch with an ex situ isotropic etch such as the $Ar—Cl_2$ etch as this provides a substantially damage-free surface without excessively increasing the surface roughness. Preferably, where the ex situ $Ar—Cl_2$ inductively coupled etch is used, it is followed by the in situ and the duration of the in situ etch is typically in the range about 3 minutes to about 15 minutes.

An $Ar—Cl_2$ inductively coupled plasma etch may carried out at an operating pressure in the range of about 0.5 mTorr (about 0.0667 Pa) to about 100 mTorr (about 13.3 Pa), more preferably in the range of about 1 mTorr (about 0.133 Pa) to about 30 mTorr (about 4.00 Pa), more preferably in the range about 2 mTorr (about 0.267 Pa) to about 10 mTorr (1.33 Pa). The etchant is preferably a gas mixture consisting of at least an inert gas, preferably argon, and a halogen-containing gas, preferably chlorine ($Cl_2$). Preferably the halogen containing gas is present in the gas mixture added to the process in a concentration (by volume) in the range of between about 1% and about 99%, more preferably between about 20% and about 85%, more preferably between about 40% and about 70%. Preferably the majority of the balance of the gas mixture is made up with Ar, more preferably the whole of the balance of the gas is made up with Ar.

Alternatively the inert gas may be helium, neon, krypton or xenon, or may comprise a mixture of more than one of these, or may comprise a mixture of one or more of these with argon.

It is also important when producing the single crystal CVD diamond host material that the impurity content of the environment in which the CVD growth takes place is properly controlled. More particularly, the diamond growth must take place in the presence of an atmosphere containing substantially no nitrogen, i.e. less than about 300 parts per billion (ppb, as a molecular fraction of the total gas volume), and preferably less than about 100 ppb, preferably less than about 80 ppb, preferably less than about 50 ppb, preferably less than about 20 ppb. The role of nitrogen in the synthesis of CVD diamond, particularly polycrystalline CVD diamond, has been reported in the literature. For example, it has been noted in these reports that gas phase nitrogen levels of 10 parts per million or greater modify the relative growth rates between the {100} and the {111} faces with an overall increase in growth rate, and in some cases crystal quality. Further, it has been suggested that for certain CVD diamond synthesis processes, low nitrogen contents of below a few parts per million may be used. Measurement of nitrogen levels of these low values requires sophisticated monitoring such as that which can be achieved, for example, by gas chromatography. An example of such a method is now described:

(1) Standard gas chromatography (GC) art consists of: A gas sample stream is extracted from the point of interest using a narrow bore sample line, optimised for maximum flow velocity and minimum dead volume, and passed through the GC sample coil before being passed to waste. The GC sample coil is a section of tube coiled up with a fixed and known volume (typically 1 cm³ for standard atmospheric pressure injection) which can be switched from its location in the sample line into the carrier gas (high purity He) line feeding into the gas chromatography columns. This places a sample of gas of known volume into the gas flow entering the column; in the art, this procedure is called sample injection.

The injected sample is carried by the carrier gas through the first GC column (filled with a molecular sieve optimised for separation of simple inorganic gases) and is partially separated, but the high concentration of primary gases (e.g. $H_2$, Ar) causes column saturation which makes complete separation of the nitrogen difficult. The relevant section of the effluent from the first column is then switched into the feed of a second column, thereby avoiding the majority of the other gases being passed into the second column, avoiding column saturation and enabling complete separation of the target gas ($N_2$). This procedure is called "heart-cutting".

The output flow of the second column is put through a discharge ionisation detector (DID), which detects the increase in leakage current through the carrier gas caused by the presence of the sample. Chemical identity is determined by the gas residence time which is calibrated from standard gas mixtures. The response of the DID is linear over more than 5 orders of magnitude, and is calibrated by use of special calibrated gas mixtures, typically in the range of 10-100 ppm, made by gravimetric analysis and then verified by the supplier. Linearity of the DID can be verified by careful dilution experiments.

(2) This known art of gas chromatography has been further modified and developed for this application as follows: The processes being analysed here are typically operating at $50-500\times10^2$ Pa. Normal GC operation uses the excess pressure over atmospheric pressure of the source gas to drive the gas through the sample line. Here, the sample is driven by attaching a vacuum pump at the waste end of the line and the sample drawn through at below atmospheric pressure. However, whilst the gas is flowing the line impedance can cause significant pressure drop in the line, affecting calibration and sensitivity. Consequently, between the sample coil and the vacuum pump is placed a valve which is shut for a short duration before sample injection in order to enable the pressure at the sample coil to stabilise and be measured by a pressure gauge. To ensure a sufficient mass of sample gas is injected, the sample coil volume is enlarged to about 5 $cm^3$. Dependent on the design of the sample line, this technique can operate effectively down to pressures of about $70\times10^2$ Pa. Calibration of the GC is dependent on the mass of sample injected, and the greatest accuracy is obtained by calibrating the GC using the same sample pressure as that available from the source under analysis. Very high standards of vacuum and gas handling practice must be observed to ensure that the measurements are correct.

The point of sampling may be upstream of the synthesis chamber to characterise the incoming gases, within the chamber to characterise the chamber environment, or downstream of the chamber to measure a worst case value of the nitrogen concentration within the chamber.

The source gas may be any known in the art and will contain a carbon-containing material which dissociates producing radicals or other reactive species. The gas mixture will also generally contain gases suitable to provide hydrogen or a halogen in atomic form.

The dissociation of the source gas is preferably carried out using microwave energy in a reactor examples of which are known in the art. However, the transfer of any impurities from the reactor should be minimised. A microwave system may be used to ensure that the plasma is placed away from all surfaces except the substrate surface on which diamond growth is to occur and its mount. Examples of preferred mount materials are: molybdenum, tungsten, silicon and silicon carbide. Examples of preferred reactor chamber materials are stainless steel, aluminium, copper, gold, platinum.

A high plasma power density may be used, resulting from high microwave power (typically 3-60 kW, for substrate diameters of 50-150 mm) and high gas pressures ($50-500\times10^2$ Pa, and preferably $100-450\times10^2$ Pa).

Using the above conditions it has been possible to produce high quality single crystal CVD diamond layers having a total nitrogen concentration of 20 ppb or less and with a value for the product of mobility and lifetime, $\mu\tau$, in excess of $1.5\times10^{-6}$ $cm^2V$, e.g. $320\times10^{-6}$ $cm^2/V$ for electrons and $390\times10^{-6}$ $cm^2/V$ for holes.

Alternatively, the layer of single crystal diamond material of the host material of the present invention may be produced by a method comprising;

providing a diamond substrate having a surface which is substantially free of crystal defects;

providing a source gas mixture comprising high purity gases, wherein the concentration of nitrogen in the source gas mixture is about 300 ppb or less;

providing a solid carbon source, wherein the solid carbon source has a low nitrogen impurity content;

activating and/or dissociating at least a portion of the source gas mixture and the solid carbon source to form gaseous carbon species; and allowing homoepitaxial diamond growth on the surface of the substrate.

The source gas used will generally contain hydrogen, one or more noble gases, such as helium, neon or argon, and oxygen and the gases which make up the source gas are high purity gases. This means that the gases have a high chemical purity. As nitrogen is the most abundant gas in the atmosphere, it is the impurity which is most commonly incorporated into a gas source. It is also readily incorporated into diamond as a substitutional impurity atom. In this regard, the chemical purity of a particular gas can be quantified by reference to the content of nitrogen impurities present therein. In particular, the hydrogen gas which forms part of the source gas preferably contains about 1 ppm or less of nitrogen impurities, the noble gas preferably contains about 1 ppm or less of nitrogen impurities and/or the oxygen gas preferably contains about 1 ppm or less of nitrogen impurities.

In this method, the carbon source is a solid carbon source which is activated to produce gaseous carbon species which are then used for homoepitaxial diamond growth on the substrate. Examples of suitable solid carbon sources include graphite and diamond. Typically such solid sources are made from gaseous precursors (such as $CH_4$). In one embodiment, the solid carbon source is diamond. In another embodiment, the solid carbon source is graphite which has been prepared so as to ensure that the uptake of nitrogen into the graphite structure is minimised.

As has been described above, nitrogen is the most abundant gas in the atmosphere and as a consequence, it is difficult to avoid contamination of gaseous carbon sources with nitrogen. However, the present inventors have found that this effect can be minimised by using a solid carbon source. In this regard, the present inventors have realised that by activating the solid carbon source to form gaseous carbon species and then re-depositing the gaseous species, the solid formed has an enhanced chemical purity (i.e. reduced nitrogen content). This means that the chemical purity of the carbon source gas used to produce the solid carbon source may be reduced while it is still possible to obtain a high chemical purity product.

The carbon source is selected so as to have a low nitrogen impurity content. The term "low nitrogen impurity content" is used herein to refer to a concentration of nitrogen of about 10 ppm or less. Preferably the concentration of nitrogen in the solid carbon source as measured by SIMS or combustion analysis is preferably about 5 ppm or less, preferably about 2 ppm or less, preferably about 1 ppm or less.

Where the solid carbon source is diamond, it may be produced by conventional HPHT using a solid carbon source or by CVD techniques using a carbon source gas that is of typical chemical purity for such commercially available gases (i.e. the carbon-containing gas that comprises the source gas is not necessarily of high chemical purity). In a CVD process, although such carbon source gases are likely to include undesirably high contents of nitrogen, it has been found that only about one thousandth of the nitrogen present in the synthesis environment is incorporated into the solid diamond. Where this diamond is then used as a solid carbon source in a method according to the present invention, the gaseous carbon species produced by activating the solid carbon source necessarily have a lower nitrogen content than the initial carbon source. Thus, the present invention provides a means for refining the chemical purity of the carbon source gas so as to significantly reduce the content of nitrogen in the final CVD diamond layer.

In an embodiment of the present invention where a solid carbon source is used, the concentration of nitrogen in the source gas mixture used for the synthesis of the solid carbon source by a CVD method is about 10 ppm or less preferably about 3 ppm or less, preferably about 1 ppm or less, preferably about 300 ppb or less, alternatively about 100 ppb or less, alternatively about 30 ppb or less, alternatively about 10 ppb or less. The concentration of nitrogen in the source gas can be determined by gas chromatography. It is desirable to minimise the content of nitrogen in the source gas mixture as this will ultimately minimise the amount of nitrogen which is incorporated into the diamond material. This, in turn, is desirable as it increases the quality of the material provided and hence makes it particularly useful as a host material for a quantum spin defect.

Source gas mixtures which contain nitrogen in this amount are commercially available. Examples of source gases are $H_2$ with an impurity content of less 0.5 ppm by volume (e.g. "$H_2$ 6.5" available from, for example, CK Gases Ltd., Hook, Hampshire, UK), which may be further purified by passage through a Pd diffuser (e.g. Johnson Matthey Inc., West Chester, Pa., USA) to achieve impurity levels of less than 5 ppb by volume; Ar with an impurity content of less than 1 ppm by volume (e.g. "Ar 6.0" available from for example CK Gases Ltd., Hook, Hampshire UK), which may be further purified by passage through a purifier (e.g. Johnson Matthey Inc., West Chester, Pa., USA) to achieve impurity levels of less than 5 ppb by volume.

Where a solid carbon source is used in the method of the present invention, the source gas mixture preferably contains minimal deliberately added carbon-containing gases. In this regard, the solid carbon source preferably provides about 80% or more, preferably about 85% or more of the carbon, preferably about 90% or more, preferably about 95% or more, preferably about 98% or more, preferably about 99% or more, preferably substantially 100% of the carbon-containing gases used in the method. It is therefore preferred that the only carbon-containing species present in the source gas mixture will be those which are present as impurities.

At least a portion of the solid carbon source is activated in the method of the present invention to provide gaseous carbon species.

"Activation" of the solid carbon source means converting the solid carbon to gaseous carbon and carbon-containing species, including, for example, species such as atomic carbon, $CH_x$ radicals, where x is 1, 2 or 3; radicals containing multiple carbon atoms, such as $C_2H_x$, where x is an integer between 1 and 5, and molecular species such as $CH_4$. It is well established in the art that the gaseous source of carbon has negligible impact on the carbon species contributing to the growth process, and thus to the quality of the diamond, and the inventors have here demonstrated that this is surprisingly also true for solid carbon sources.

The inventors have identified two general methods whereby the solid carbon source is activated:
(i) activation within the same chamber as the diamond deposition occurs, and,
(ii) activation remote from the chamber in which the diamond deposition occurs.

The latter of these two techniques (method (ii)) is preferred as this method allows much greater control over the rate of activation of the solid carbon source, and hence greater control of the concentration of C present in the re-deposition process to form the diamond material of the present invention.

In an embodiment where the activation occurs remotely, the activation of the solid carbon source preferably takes place in a reactor (referred to herein as the "activation reactor"), such as a chemical vapour deposition reactor, comprising a chamber, a gas inlet, a gas outlet, and, where the energy source used for the activation is a microwave plasma, a means of supplying microwave energy to the reactor. Where microwaves are the energy source, the chamber of the activation reactor is preferably a resonant cavity for the frequency of microwaves being used. Preferably, the solid carbon source is heated by means of a microwave plasma. The source gas, typically a mixture of hydrogen and argon, is passed over the solid carbon source and energy is supplied by means of a plasma, such as a microwave plasma, a hot filament, or by direct heating of the solid carbon source. The solid carbon source is heated to a temperature of between about 700° C. and about 1200° C., the exact temperature being selected so as to supply gaseous carbon species to the diamond deposition reactor at the desired rate. As the gas mixture produced in the activation reactor should be fed into the diamond deposition reactor, the pressure in the activation reactor must be higher than that in the diamond deposition reactor. Alternatively, the gas mixture from the activation reactor may be compressed (i.e. its pressure increased) before being fed into the diamond deposition reactor or, alternatively fed into a storage facility for subsequent delivery to the diamond deposition reactor. Direct feeding of the gas into the diamond deposition reactor is preferred as this reduces the possibility of contamination of the gas by impurities, such as $N_2$, during compression and/or storage.

Alternative methods of activation with which the person skilled in the art will be familiar, such as the use of lasers to locally ablate the carbon source are also possible.

In an embodiment wherein activation of the solid carbon source occurs within the same chamber as the diamond deposition, the reactor is a CVD diamond deposition reactor in which the solid carbon source is disposed such that it can be etched by hydrogen radicals to produce gaseous carbon species that subsequently re-deposit on an adjacent single crystal diamond substrate to form a single crystal CVD diamond layer of high chemical purity.

In an alternative embodiment, the layer of single crystal diamond material of the solid state system of the present invention may be produced by a method comprising
- providing a diamond substrate having a surface which is substantially free of crystal defects;
- providing a source gas mixture comprising high purity gases and a carbon source gas, wherein the high purity gases contribute about 300 ppb or less to the total nitrogen levels in the source gas mixture and the carbon source gas contains nitrogen impurities in amount of about 20 ppm or less;
- dissociating the source gas; and
- allowing homoepitaxial diamond growth on the surface, wherein at least one of the following conditions is satisfied:
  (a) the temperature of the substrate is in the range from about 800° C. to about 1000° C.; and
  (b) oxygen is added to the source gas in an amount of between about 0.5% and about 5% by volume, measured by volume fraction as $O_2$ equivalent, of the total source gas mixture.

In this embodiment, the carbon source is a gas. Examples of suitable carbon source gases include, but are not limited to, $C_xH_y$, wherein each of x and y may independently be an integer from 1 to 10 (e.g. $CH_4$, $C_2H_6$, $C_2H_4$, $C_2H_2$, etc.), $C_xH_yHal_z$, wherein x and z may independently be an integer from 1 to 10 and y may be 0 to 10 or $CO_x$, wherein x is in the range from 0.5 to 2.0. Preferably the carbon source gas is $CH_4$. In particular, where the carbon source is gaseous and contains nitrogen impurity at a level of less than about 20 ppm but sufficiently high to add significantly to the overall nitrogen concentration in the process (e.g. greater than about 1 ppm), the inventors have found that a product having a high chemical purity can be obtained by optimising the process conditions.

More specifically, it has been found that material having a high chemical purity may be obtained by either:
(i) ensuring that the substrate temperature is above about 800° C. and below about 1000° C.; or,
(ii) adding oxygen to the source gas mixture in the range from about 0.5% of the total gas flow to about 5% measured by volume fraction as $O_2$ equivalent of the total gas flow.

The oxygen concentration is measured as the volume fraction (expressed as a percentage) that comprises the total gas flow; for example, where the total gas flow is 500 sccm (standard cubic centimeters) of which 10 sccm is $O_2$, the volume fraction of $O_2$ equivalent is 2%; for example, where the total gas flow is 500 sccm of which 10 sccm is CO, the volume fraction of $O_2$ equivalent is 1%.

Without wishing to be bound by theory, the optimum temperature range in feature (i) above is believed by the inventors to be determined by two opposing factors. Firstly, the inventors have found experimentally that for identical substrate and growth conditions, the level of nitrogen incorporation, as measured by techniques such as SIMS and EPR, is reduced as the substrate temperature is increased from about 700° C. to about 1000° C. Without being bound by any particular theory, it is thought that this is a consequence of the sticking coefficient of N atoms to the diamond growth surface decreasing as the substrate temperature increases. Secondly, the inventors have found experimentally that for a given thickness of CVD diamond growth, the growth surface of the CVD diamond layer shows increased roughening, as characterized by the observation of macro steps, hillocks and twins, as the substrate temperature is increased from about 700° C. to about 1000° C. Without being bound by any particular theory, this increased roughening is believed to provide more radical sites for incorporation of N and other defects into the growing diamond film. Thus the inventors have identified two competing effects, one of which causes the nitrogen incorporation to decrease as the substrate temperature increases and the other causes the nitrogen incorporation to increase as the substrate temperature increases. Since the rate of change of these two effects with temperature is not the same for any chosen thickness of CVD diamond growth, a growth temperature can be identified at which the incorporation of nitrogen is minimised for a given layer thickness.

In this regard, the substrate temperature is preferably above about 840° C., preferably above about 860° C., preferably above about 880° C., preferably above about 900° C., preferably above about 920° C., preferably above about 950° C. Most preferably, the substrate temperature is in the range from about 950° C. to about 1000° C.

Regarding feature (ii) above and without being bound by any particular theory, it has been found experimentally that the addition of a small amount of oxygen to the source gas mixture in the amount described in (ii) above, reduces the surface roughening effects associated with increasing substrate temperature (which in turn causes increased nitrogen uptake) and consequently there is a reduced the incorporation of N at any specific thickness of CVD diamond growth and growth temperature compared with the same conditions except for the absence of the oxygen addition.

The oxygen which is added is either in the form of $O_2$ or in the form of oxygen-containing species, such as $CO_x$, wherein x is in the range from 0.5 to 2, for example CO or $CO_2$.

Oxygen is preferably added to the source gas mixture in an amount in the range from about 1% by volume of the total gas flow to about 3% by volume of the total gas flow, preferably from about 1% by volume of the total gas flow to about 2% by volume of the total gas flow Where a gaseous carbon source is used, it contains nitrogen in a concentration of about 20 ppm or less, alternatively about 10 ppm or less, alternatively about 5 ppm or less, alternatively about 3 ppm or less, alternatively about 1 ppm or less, alternatively about 0.5 ppm or less. Such carbon sources are commercially available.

This technique is particularly appropriate when the carbon source contains nitrogen at a concentration of about 1 ppm or more, alternatively about 2 ppm or more, alternatively about 5 ppm or more.

Thus, a method is provided whereby using either (i) or (ii) or both (i) and (ii), the nitrogen impurity content of a CVD diamond layer can be minimised.

The present inventors have found that commercially available gaseous carbon sources that contain a greater concentration of nitrogen may be refined by forming a solid carbon source as described above.

More specifically, a solid carbon source, such as polycrystalline diamond may be formed by conventional CVD techniques using a lower chemical purity carbon source gas. In this method, approximately one thousandth of the nitrogen present in the synthesis environment will be incorporated into the diamond material produced. The polycrystalline diamond can then be activated to provide a gaseous carbon source having an improved chemical purity.

In this regard, the present invention contemplates combining the two methods described, specifically by using a solid carbon source in combination with ensuring that one or both of conditions (i) and (ii) are satisfied.

After production according to the methods detailed above, the surface of the layer of single crystal CVD diamond material is processed such that the surface roughness, $R_q$ of the surface within an area defined by a circle of radius of about 5 µm, preferably about 10 µm, preferably about 20 µm, preferably about 50 µm, preferably about 100 µm centred on the point on the surface nearest to the quantum spin defect to be used or, where the quantum spin defect is to be provided subsequent to the processing of the surface by a process such as ion implantation, nearest to the intended location of the quantum spin defect, is about 10 nm or less, about 5 nm or less, about 2 nm or less, about 1 nm or less, about 0.5 nm or less, about 0.2 nm or less, about 0.1 nm or less.

If the surface has macroscopic curvature, e.g. a lens with a radius of curvature of between about 10 µm and about 100 µm to collect and focus the light output from the quantum defect centre, then the roughness is referenced to the macroscopic curvature. The roughness of such objects may be measured using scanning probe instruments (e.g. using an atomic force microscope) whereby the underlying curvature may be subtracted from the roughness of the surface.

The flatness and roughness of the surface may be improved by subjecting the surface of the diamond material to conventional mechanical processing including, for example, scaife polishing. Such techniques are well known in the art. While mechanical processing operations improve the flatness (as might be measured by a macroscopic method known in the art, such as interferometry) and reduce the roughness (as described by the $R_a$ or $R_q$) of the surface of the diamond material, at the same time such preparation may introduce subsurface damage which may be undesirable. The presence of subsurface damage is particularly undesirable where the diamond material is to be used for spintronic applications where, for accurate read out and characterisation of quantum spin defects located within the material, it is important that the quality of the material to a depth of approximately 100 µm below the surface is high.

Therefore, after mechanical processing, the diamond surface may be treated with an etch, preferably an isotropic etch, and/or a regrowth step. An isotropic etch may be used to retain or form macroscopic curved features, such as a lens, whilst controlling or reducing the surface roughness.

An etched surface means the removal of a minimum thickness of material from the as mechanically processed surface based on grit size of last mechanical process, to provide a surface which is free or substantially free of mechanical processing damage (subsurface damage), and is also free or substantially free of damage etch features.

Preferably the etching is achieved by Inductively Coupled Plasma (ICP) etching, preferably using a gas mixture containing a halogen and an inert gas, preferably where the inert gas is argon, and preferably where the halogen is chlorine. The Ar/Cl plasma etch cleans the surface(s) of the diamond layer that may have other chemical species present on them as surface contaminants either with paramagnetic properties, or carrying electrical charge.

An isotropically etched surface does not substantially increase the $R_q$ of the surface. $R_q$ measurements $R_q^a$ and $R_q^b$ preferably made using a scanning probe instrument are taken on the same area of the surface of the diamond layer. By "same area" is meant an equivalent area as close as reasonably practical, using multiple measurements and statistical analysis where necessary to verify the general validity of the measurements, as is known in the art. In particular the isotropically etched surface may have a roughness $R_q^a$ (after the etch) and the original surface a roughness $R_q^b$ (before the etch), such that $R_q^a/R_q^b$ is preferably less than 1.5, more preferably less than 1.4, more preferably less than 1.2, more preferably less than 1.1, and in addition, the isotropic etch preferably provides at least one, preferably at least two of the following features:

an etched surface which is smooth and preferably smoother than the original surface prior to the etch, and in particular where the $R_q$ of the etched surface ($R_q^a$) is preferably less than 10 nm, preferably less than 5 nm, preferably less than 2 nm, preferably less than 1 nm, preferably less than 0.5 nm, preferably less than 0.3 nm;

removal of a thickness of material exceeding at least 0.2 µm, more preferably at least 0.5 µm, more preferably at least 1.0 µm, more preferably at least 2 µm, more preferably at least 5 µm, more preferably at least 10 µm.

Removal, by etching, of a minimum thickness of diamond from the as mechanically processed surface based on grit size of last mechanical process, to provide a surface which is free or substantially free of mechanical processing damage, requires the removal of sufficient depth to significantly reduce the surface damage and thus needs removal by etching of the same order of thickness as the surface damage layer. Typically surface damage layers have thicknesses in the range of 0.2 µm to 20 µm (or thicker if very aggressive lapidary techniques have been used). Thus, preferably the etch removes a thickness of diamond from the surface, where the thickness of diamond removed is at least 0.2 µm, more preferably at least 0.5 µm, more preferably at least 1.0 µm, more preferably at least 2 µm, more preferably at least 5 µm, more preferably at least 10 µm. The surface damage layer typically has a thickness that is about the same as the size of the largest diamond grit particle used for the last stage of any lapidary processing; for example a surface scaife polished with 1-2 µm sized diamond grit will typically have a surface damage layer about 2 µm thick. Therefore, to minimise the amount of damage from lapidary processing that remains after etching by the method of the invention, the amount of material removed by the method of the invention should preferably be at least 0.2 times the size of the largest grit particles, more preferably at least 0.5 times the size of the largest grit particles, more preferably at least 0.8 times the size of the largest grit particles, more preferably at least 1.0 times the size of the largest grit particles, more preferably at least 1.5 times the size of the largest grit particles, more preferably at least 2 times the size of the largest grit particles. After the etch, the surface of the diamond layer preferably has a surface roughness after the etch, $R_q^a$, of less than 10 nm, more preferably less than 5 nm, more preferably less than 2 nm, more preferably less than 1 nm, more preferably less than 0.5 nm, more preferably less than 0.3 nm.

The etched surface may extend across the whole of a surface of the diamond layer, or across a proportion of the surface such as structural features (such as optical waveguides) etched into the surface, using known techniques such as photolithography, this portion of the surface then forms the surface of the diamond layer, per se.

Furthermore, the etched diamond surface with low $R_q^a$ preferably is substantially free of processing damage such that the number of defects revealed by the revealing etch test is about $5 \times 10^3$ per mm² or less, preferably about 100 per mm² or less.

An example of a suitable isotropic etch is an Ar—$Cl_2$ inductively coupled plasma etch may carried out at an operating pressure in the range of about 0.5 mTorr (about 0.0667 Pa) to about 100 mTorr (about 13.3 Pa), more preferably in the range of about 1 mTorr (about 0.133 Pa) to about 30 mTorr (about 4.00 Pa), more preferably in the range about 2 mTorr (about 0.267 Pa) to about 10 mTorr (about 1.33 Pa). The etchant is preferably a gas mixture consisting of at least an inert gas, preferably argon, and a halogen-containing gas, preferably chlorine ($Cl_2$). Preferably the halogen containing gas is present in the gas mixture added to the process in a concentration (by volume) in the range about 1%-about 99%, more preferably about 20%-about 85%, more preferably about 40%-about 70%. Preferably the majority of the balance of the gas mixture is made up with Ar, more preferably the whole of the balance of the gas is made up with Ar.

Furthermore, the etched diamond surface with low $R_q{}^a$ preferably is substantially free of processing damage such that the number of defects revealed by the revealing etch test is about $5 \times 10^3$ per $mm^2$ or less, preferably about 100 per $mm^2$ or less.

Where the surface is formed by growth it can be restricted to a portion of a surface of the diamond layer by using masking techniques, this portion then corresponds to the surface of the diamond layer, or, more preferably, it can extend across the whole of a surface of the diamond layer, this whole surface forming the surface of the diamond layer according to the invention.

A surface formed by regrowth means growing a second thin diamond layer, where the surface of this thin layer is then used as the surface of the diamond layer in its as grown state without further mechanical processing or etching to remove diamond material and alter the diamond surface.

The second thin diamond layer is preferably grown by CVD synthesis and is thin to limit the formation of macroscopic growth steps. The thickness of this layer, grown onto a previously mechanically prepared surface, is about 100 µm or less, preferably about 50 µm or less, preferably about 30 µm or less, preferably about 20 µm or less, preferably about 10 µm or less, preferably about 3 µm or less, preferably about 1 µm or less, preferably about 100 nm or less, preferably about 50 nm or less, preferably about 20 nm or less, preferably 10 nm or less. The thickness of the second thin diamond layer may be about 1 nm or more, preferably about 10 nm or more, preferably about 30 nm or more, preferably about 100 nm or more, preferably about 300 nm or more, preferably about 1 µm or more. In some embodiments, the thickness of this layer, grown onto a previously mechanically prepared surface is between about 100 nm and about 50 µm, alternatively between about 500 nm and about 20 µm, alternatively between about 1 µm and about 10 µm.

The second thin diamond layer may be prepared using a number of techniques including monolayer growth techniques and use of off-axis surfaces to control the propagation of surface steps and thus retain a very flat and smooth surface.

In some embodiments the second thin layer either contains or will contain the quantum spin defect. In such embodiments, preferably the second thin layer is prepared using the techniques described herein such that the carbon is the nitrogen content of the layer is minimised by using one or more of the techniques described herein.

The surface of the second thin diamond layer forms the surface of the diamond layer and preferably has an $R_q$ of about 10 nm or less, preferably about 5 nm or less, preferably about 3 nm or less, preferably about 2 nm or less, preferably about 1 nm or less, preferably about 0.5 nm or less, preferably about 0.3 nm or less, preferably about 0.2 nm or less, preferably about 0.1 nm or less. Thus, this surface has very low surface roughness and in addition is free of processing damage.

The techniques of etching, preferably isotropic etching, and regrowth, discussed above, may be combined, such that a surface is first etched and then a thin layer regrown to form the surface of the diamond layer. This approach is generally advantageous only if the etch has not been completed to sufficient depth to remove all mechanical processing damage.

It is advantageous to prepare a surface of the single crystal CVD diamond host material of the solid state system of the present invention, preferably by isotropic etching, and regrowth techniques discussed above. This preparation ensures that the portion of the diamond material adjacent to the prepared surface, in particular, is substantially free of defects and impurities such that where the material is to be used for spintronic applications, optical reading and writing of the quantum spin defects is possible.

A surface of the layer of single crystal CVD diamond may be treated in order to control surface termination. Diamond surfaces rarely consist of bare carbon atoms, except under conditions of extremely low pressure (e.g. a few µTorr of pressure) and only then if the terminating species are desorbed by heating to a few hundred ° C. The most common terminating species are H, O and OH in all their isotopic forms. In particular, it is desirable to minimise termination of the surface with species having non-zero electronic and/or non-zero nuclear magnetic spin quantum numbers as these may affect the decoherence time and/or spectral stability of any quantum spin defects present in the material. In particular, it may be desirable to terminate the surface of the diamond with atoms that have either a nuclear spin quantum number equal to zero or an electronic spin quantum numbers equal to zero or both a nuclear and an electronic spin quantum number equal to zero. Hydrogen ($^1H$) has a nuclear spin quantum number of ½ and therefore can cause splitting of transitions of the $NV^-$ defect via hyperfine interaction; deuterium ($^2H$) has a nuclear spin quantum number of 1 and therefore can cause splitting of transitions of the $NV^-$ defect via hyperfine interaction. Therefore these two isotopes are likely to have a detrimental impact on the decoherence time and/or spectral stability of a quantum spin defect. The isotope $^{16}O$ has a nuclear spin quantum number of zero; therefore there is no hyperfine interaction with the $NV^-$ quantum spin defect and $^{16}O$ has no effect on the decoherence time or spectral stability through hyperfine interactions. Therefore termination with $^{16}O$ over other possible terminating species is believed to be beneficial. Natural abundance oxygen contains 99.76% $^{16}O$.

It is believed by the inventors that a substantially fully $^{16}O$ oxygen-terminated surface does not have any unpaired electrons and therefore there should be no interaction between the electrons of the $^{16}O$ terminating atoms and the unpaired electron of the $NV^-$ centre comprising the quantum spin defect.

A $^{16}O$ terminated surface may be prepared, for example, by exposure of the surface to a low-pressure $^{16}O$ plasma under conditions that are not sufficient to substantially etch the surface (e.g. between about 1 minute and 15 minutes in a $^{16}O$ plasma at a pressure of about 20 Pa in a BioRad PT7150 RF Plasma Barrel Etcher).

Preferably the fraction of area of the surface closest to the quantum spin defect that is terminated with $^{16}O$ is about 95% or more, about 98% or more, about 99% or more, about 99.5% or more, about 99.8% or more, about 99.9% or more.

The surface termination may be characterised by techniques known in the art such as X-ray photoelectron spectroscopy.

The solid state systems of the present invention further comprise a quantum spin defect. Preferably the quantum spin defect is an NV centre, preferably an $NV^-$ centre.

Where the quantum spin defect is an $NV^-$ centre it may be formed by nitrogen ion implantation, nitrogen atom implantation or nitrogen-containing ion implantation. Alternatively, the $NV^-$ centres may be grown into the diamond layer. The term "grown in" means that the NV centres form spontaneously during the growth of the layer from N atoms and vacancies incorporated at the growth surface. Specifically, it is well known in the art that an approximately thermodynamic equilibrium concentration of vacancies exists on the growth surface of a CVD diamond and that a proportion of these are incorporated into the bulk diamond. Thus, there is a small but finite chance of an N atom and a vacancy being incorporated into the solid adjacent to each other such that they spontaneously form an NV centre.

Where the quantum spin defect is an NV$^-$ centre it may comprise $^{14}$N or $^{15}$N. It is preferred that the NV$^-$ centre comprises either solely $^{14}$N or solely $^{15}$N and not a mixture of $^{14}$N and $^{15}$N. It is advantageous for the N atom of the NV$^-$ centre to be a single isotope as this means that the energies of the electronic transitions are the same for all cases. The formation of single isotope NV$^-$ centres is wholly compatible with the production of those centres by an ion implantation technique.

Ion implantation may be employed to deliver one or more atomic species into and beneath the surface of the diamond material in order to form a NV$^-$ centre implanted layer with a peak concentration of implanted atoms at a predetermined depth beneath the surface of the diamond layer. A capping layer of diamond may then be synthesised on the diamond layer into which the NV$^-$ centres have been implanted. The capping layer of diamond is preferably synthesised using the methods described herein.

Post growth, NV$^-$ centres can be formed in the diamond layer by using ion implantation methods known in the art, followed by annealing in vacuum or in an inert atmosphere in the temperature range from about 600° C. to about 900° C., preferably from about 750° C. to about 850° C. for a time period of between about 0.1 hours and about 16 hours, preferably between about 0.5 hours and about 8 hours, preferably between about 1 hour and about 6 hours, preferably between about 2 hours and about 4 hours. Within this temperature range, the vacancies in the diamond layer that are produced as a by product of the ion implantation process become mobile. Within this temperature range, substitutional N has a large cross-section for vacancy capture and therefore during the annealing process NV centres are formed.

Advantageously, the layer of single crystal diamond of the present invention may be subjected to a further annealing step either before or after formation of the NV$^-$ centres. Where a further annealing step is included, it is preferably carried out at a temperature of greater than about 1000° C., preferably greater than about 1100° C., preferably greater than about 1200° C., preferably greater than about 1300° C., preferably greater than about 1400° C., preferably greater than about 1500° C., preferably greater than about 1600° C. for a time period of between about 0.1 hours and about 16 hours, preferably between about 0.5 hours and about 8 hours, preferably between about 1 hour and about 6 hours, preferably, between about 2 hours and about 4 hours. This annealing step may be performed under vacuum at a pressure of less than about $1 \times 10^{-3}$ Pa (that is approximately $1 \times 10^{-5}$ mbar) or, preferably under ultra high pressure conditions, such that diamond is the thermodynamically stable form of carbon (widely referred to as "diamond stabilising pressure"), typically between about 4 GPa and about 10 GPa depending upon the temperature. This final anneal removes any residual damage left by the implantation which can impact both T2 and the spectral stability of the NV centres.

The second annealing step has the additional advantage that any hydrogen atoms within the solid (i.e. not on the surface) become significantly mobile at temperatures above the minimum temperature for the second annealing step (i.e. above about 1000° C.). Thus, the hydrogen concentration of the material can be reduced by inclusion of such an annealing step. The concentration of hydrogen $^1$H and its isotopes is preferably about $10^{18}$ cm$^{-3}$ or less, preferably about $10^{17}$ cm$^{-3}$ or less, preferably about $10^{16}$ cm$^{-3}$ or less, preferably about $10^{15}$ cm$^{-3}$ or less. Reduction of the concentration of $^1$H in the solid is advantageous as $^1$H has a nuclear spin of ½ and so can interact with NV centres to reduce the T2 time thereof.

Preferably, the quantum spin defects are formed within about 100 µm or less, preferably about 50 µm or less, preferably about 30 µm or less, preferably about 20 µm or less, preferably about 10 µm or less, preferably about 5 µm or less, preferably about 2 µm or less, preferably about 1 µm or less of a surface of the host material, preferably the surface of the host material which has been processed as described above. This is advantageous as it means that the NV centres can be characterised and read by use of optical devices.

Using ion implantation the quantum spin defect formed in the single crystal diamond layer is accurately placed such that an array of quantum spin defects may be produced within a diamond layer. The array of quantum spin defects may be one, two or three-dimensional within the diamond layer. The quantum spin defects may be distributed homogeneously or non-homogeneously in the arrays. A three-dimensional array may be formed using an implanting process by implanting the atoms or ions at different energies. Furthermore, the synthetic diamond material may comprise a number of diamond layers each diamond layer comprising at least one quantum spin defect.

There is a multiplicity of ways in which a number of quantum spin defects can be arranged in either a one-dimensional array or a two-dimensional array, and the foregoing discussion does not preclude the use of any particular array. Where the quantum spin defects are in a one-dimensional array, in which a number of quantum spin defects are arranged along a line, the quantum spin defects may be uniformly spaced or non-uniformly spaced. It is preferred that the quantum spin defects are uniformly spaced as this enables better control of their interactions with each other. Where the quantum spin defects are arranged in a one-dimensional array, the array may be aligned with a crystallographic direction lying in the surface of the synthetic diamond layer; for example, for a surface that has a normal within about 3° of the [001] direction, the array may be within about 5° of a <100> or <110> direction.

Where the quantum spin defects are arranged in a two-dimensional array, the distribution of the quantum spin defects along each of the two the axes of the array may be the same or different, uniform or non-uniform. The axes of the array may be orthogonal or non-orthogonal. A preferred two-dimensional array has orthogonal axes wherein the quantum spin defects are spaced uniformly along the axes. Where the two-dimensional array has orthogonal axes, the axes may be aligned with a crystallographic direction lying in the surface of the synthetic diamond layer; for example, for a surface that has a normal within about 3° of the [001] direction, the axes of the two dimensional array may be within about 5° of a <100> or <110> direction.

While spintronic applications require a stable and controllable source of single photons, experimental practicalities place limitations on the distance between nearest NV centres. These practicalities are related to optical/magnetic methods of being able to read/write to a single defect and also the impact of a high concentration of paramagnetic defects on the parameter T2.

While ensemble EPR measurements offer the possibility via the W15 EPR centre to determine an upper limit on the NV⁻ concentration of ~0.05 ppb, confocal photoluminescence (PL) measurements enable quantification to very low levels. A schematic showing how this might be done is shown in FIG. 15. Detection of single NV centres at room temperature can be achieved using confocal microscopy. The confocal microscopy technique is known in the art and that employed is described in Ph. Tamarat et al (J. Phys. Chem. A, 104 (2000), 1-16).

Preferably, where the quantum spin defect is an NV centre, the concentration of NV centres formed in the diamond layer is about 1 ppb or less, preferably about 0.5 ppb or less, preferably about 0.2 ppb or less, preferably about 0.1 ppb or less, preferably about 0.05 ppb or less, preferably about 0.02 ppb or less, preferably about 0.01 ppb or less, preferably about 0.005 ppb or less, preferably about 0.001 ppb or less, preferably about 0.0001 ppb or less, preferably about 0.00001 ppb or less, preferably about 0.000001 ppb or less. This concentration is advantageous because it reduces the interaction between NV centres that are not part of the quantum device, thereby increasing the decoherence time T2 and increasing the spectral stability of the NV centre comprising the quantum spin defect.

As will be appreciated by the person skilled in the art, it is the concentration and separation of the quantum spin defects which will be used as qubits in the end application of the solid state material that is of particular relevance. For example, where the quantum spin defects which are to be utilised in a spintronic application are located in a thin layer of the host material, the concentration of other quantum spin defects outside of this layer is of less importance. However, the present invention also provides solid state systems where there may, for example, be a three dimensional array of quantum spin defects distributed throughout the entirety of the host material, wherein in each of the quantum spin defects is individually addressable. In this case, the concentration and separation of all of the quantum spin defects is of particular relevance. In this regard, the present invention not limited to thin layers of host material and also extends to solid state systems comprising bulk pieces of synthetic diamond host material with substantially the same properties throughout the bulk thereof.

The decoherence time, T2, for a qubit defect centre in a host material is, in particular, reduced disadvantageously by the proximity of other defects in the host material, especially defects which have magnetic spin. The term "other defects" is used herein to refer to defects present in the host material which are not intended to act as qubit centres.

The other defects present in the single crystal diamond layer which impact on the T2 of the quantum spin defect(s) generally do so by one of four mechanisms:

Dipolar spin coupling, for example where the defect is paramagnetic and thus has spin;

Electric field or charge, for example where changes in the local electric field potential in which the qubit defect centre sits arise from charge on adjacent defects. Furthermore, such defects can change charge state for example randomly due to thermal excitation, imposing a change on the energy states of the qubit defect centre. Essentially, any defect which adds states into the band gap may cause rise to local electric fields;

Lattice strain, since this changes the local elastic properties of the lattice and thus the detailed structure of the qubit defect centre, for example then affecting the zero phonon line energy or linewidth; and Local optical properties, including absorption, refractive index and scatter; since the interaction with the qubit defect centre is generally by optical means, requiring detailed photonic structures to efficiently couple to the outside world, then all these optical aspects of the diamond material are important.

Therefore, in addition to minimising the presence of such defects, it is also desirable to ensure that the quantum spin defects are separated from other elements with magnetic spin by a distance which is sufficient to minimise any interaction.

In this regard, preferably, the quantum spin defect is separated from other elements (i.e. other NV centres) with magnetic spin such that the average distance between NV centres is 0.02 μm or greater, preferably 0.05 μm or greater, preferably 0.1 μm or greater, preferably 0.5 μm or greater, preferably 1 μm or greater, preferably 2 μm or greater, preferably 5 μm or greater, preferably 10 μm or greater, preferably 20 μm or greater, preferably 50 μm or greater. This may be characterised, for example, in a cross-sectional slice.

The distance referred to above may be the distance between an individual NV centre which is to be used as a qubit and other elements with magnetic spin or the distance between a group of two or more NV centres which are to be used together in a spintronic application and other elements with magnetic spin.

As will be appreciated by the person skilled in the art, it is the density of NV centres and the spacing of the NV centres in the portion of the diamond host material which is to be read out and/or characterised which is of importance.

Due to the high chemical purity of the single crystal CVD diamond layer of the solid state systems of the present invention, it is possible to form quantum spin defects, in particular NV centres, in the layer which have surprisingly long T2 times at room temperature.

It is particularly advantageous that these long T2 times are observed at room temperature as it means that is it not necessary to employ cryogenic temperatures.

In this regard, in the solid state systems of the present invention, the quantum spin defect has a T2 at room temperature of about 300 μs or more, preferably about 500 μs or more, preferably about 700 μs or more, preferably about 900 μS or more, preferably about 1 ms or more, preferably about 1.2 ms or more, preferably about 1.4 ms or more, preferably about 1.6 ms or more, preferably about 2.0 ms or more, preferably about 3.0 ms or more, preferably about 4.0 ms or more, preferably about 5.0 ms or more, preferably about 8 ms or more, preferably about 10 ms or more, preferably about 15 ms or more, preferably about 20 ms or more, preferably about 25 ms or more, preferably about 30 ms or more, preferably about 50 ms or more.

The maximum value of T2 is fundamentally limited by the value of T1, the "spin-lattice relaxation time". In practice it is found that the maximum value of T2 is between about one-fifth and one-tenth of the value of T1. Normally, the value of T2 will not exceed 1000 ms at room temperature.

The T2 time of a quantum spin defect can be determined using ESR methods. The ESR method that is employed to measure T2 uses Hahn echo decay to measure the lifetime of the spin coherence (i.e. T2). For example, where the quantum spin defect is an NV centre, the Hahn echo decay measurement is performed on a single NV centre with a spin polarised population. The spin polarised population is created via laser excitation from the $^3A$ ground state (i.e. $m_s=0$) up to the $^3E$ first excited triplet state (i.e. $m_s=-1$) followed by decay back into the ground state leads leaving a spin polarised state due to non-conservation of spin angular momentum (D. Redman et al, J. Opt. Soc. Am. B, 9 (1992), 768). The spin of the NV centre then undergoes a series of transformations using microwave pulses which flip the spin of the NV centre (such a sequence is illustrated in FIG. 17). The pulses take the form $\pi/2-t_O-\pi-t_O-\pi/2$ where $t_0$ is the time between the pulses. The spin of the NV centre is then read out through fluorescence. Repeating the measurement with different times between pulses makes it possible to measure the decoherence time T2.

A method for measuring T2 values is as follows. It will be appreciated by the person skilled in the art that, while this method has been described in connection with characterising NV centres, an analogous method may be used to determine the T2 values for quantum spin defects other than NV centres.

(i) A single NV centre is located using a confocal microscope system using laser excitation (shown schematically in FIG. 15).

(ii) A "coincidence measurement" is performed on the NV centre to confirm that the selected NV centre is indeed a single NV centre. This measurement uses a system similar to that used for the photon frequency stability measurement, but with a much narrower and faster scan time and with the time delay between one photon and the next photon being measured instead of the photons being counted. FIG. 14 shows the result of a coincidence test with no coincident events at zero indicating that the NV being characterised is indeed a single NV centre.

The T2 time of the identified NV centre can be now be determined.

(iii) The NV centre is excited using a continuous wave ("cw") laser operating at a wavelength of less than the ZPL of the NV⁻ centre (e.g. at 532 nm) in the presence of a magnetic field on a non-degenerate resonance (e.g. 1.299 T) to create a spin polarised population in the $m_s=0$ state (by virtue of the electronic structure of the NV centre).

(iv) The spin polarised NV⁻ centre is then subject to a series of short (a few ns in duration) intense (16 W peak power) microwave pulses with frequency of, for example, about 35 GHz separated by a "delay time", $t_0$ which is systematically varied from a less than a μs to many μs, that cause the spin state to be "flipped". The first pulse is a $\pi/2$ pulse that rotates the magnetisation into a coherent superposition of the $m_s=0$ and $m_s=-1$ states. The second pulse, a time $t_0$ after the first pulse, is a $\pi$ pulse that inverts the spin. The third pulse (another $\pi/2$ pulse), a time $2t_0$ after the first pulse, rotates the spin back to its original state. This sequence is illustrated in FIG. 16. During the sequence of microwave pulses, the intensity of fluorescence emission from the NV centre is monitored. The intensity of the fluorescence emission varies as the value of $t_0$ is varied. This process is systematically repeated with longer $t_0$ times.

(v) The fluorescence intensity (also referred to as the "Hahn echo amplitude") is plotted as function of $t_0$ time. The intensity of the fluorescence shows a modulation on an exponentially falling curve and an exponential curve (also referred to as the "electron spin echo envelope") can be fitted approximately over the peaks of the modulation. The inventors have chosen to fit their data such that:

$$I \propto \exp(-1/T_M)$$

where I is the fluorescence intensity and $T_m$ is the phase memory time, equivalent to T2. In the present case, the value of T2 has been defined as the point on the electron spin echo envelope where the value of I has decreased to $1/e \approx 0.367$ of the initial intensity (where e is well-known the transcendental number e=2.7182818 . . . ).

In the literature there are numerous approaches to the fitting of the electron spin echo envelope and extracting the value of T2. The approach described above is considered to be conservative.

This method (apart from the extraction of the T2 value from the electron spin echo envelope) is described in Charnock and Kennedy (Phys. Rev. B, 64 (2001), 041201-1 to 041201-4).

In a solid state system which comprises a quantum spin defect it is necessary that the frequency of the optical transition of the quantum spin defect which is used to read/write is stable to enable two or more defects to be tuned so that they produce quantum mechanically identical photons.

The stability of the emission from a quantum spin defect can be determined according to the method described below. It will be appreciated by the person skilled in the art that, while this method has been described in connection with characterising NV centres, an analogous method may be used to determine the stability of the emission from quantum spin defects other than NV centres.

The determination of the wavelength (or frequency) stability of the zero-phonon line emission from the NV⁻ centre at 637 nm requires the use of high-precision methods as the precision required is too high for more conventional spectroscopy methods to be used (i.e. the position of the line cannot be determined to better than about 0.05 nm, equivalent to a frequency resolution of about 30 GHz, by conventional spectroscopic methods). In effect, a measurement of the true linewidth of the ZPL is required.

In the present case, the inventors have chosen to use laser spectroscopy to determine the stability of the ZPL, although other methods disclosed in the art could be used. Laser spectroscopy on single NV centres in diamond using photoluminescence excitation (PLE) measurements at low temperature (e.g. 4 K) has been described by Jelezko et al (F. Jelezko, I. Popa, A. Gruber, C. Tietz, J. Wrachtrup, A. Nizovtsev and S. Kilin, "Single spin states in a defect center resolved by optical spectroscopy," Appl. Phys. Lett., 81 (2002), 2160-2162). The inventors have used this technique but at room temperature rather than low temperature.

The determination of the stability of the ZPL of the NV⁻ centre by PLE is performed in the following manner:

(i) A single NV centre is identified using a confocal microscope with 532 nm laser illumination and the coincidence measurement used for the determination of the T2 time.

(ii) A tuneable excitation laser (a tuneable laser capable of output at 637 nm and with frequency tuning steps of less than about 5 MHz) is focused onto the NV centre using the confocal microscope and the frequency of the laser is scanned across the NV⁻ ZPL at 637 nm, for example over a range of about 3 GHz either side of the ZPL frequency. The illumination that "reflects" back from the sample follows a light path so that it can be detected, typically using a conventional spectrometer set for admitting light at the wavelength of the ZPL.

(iii) The single NV centre absorbs the incident laser radiation only at the frequency at which the actual transition from the ground state to the excited state occurs; this is observed as decrease in the intensity measured by the detector. The frequency is correlated with the decrease in the intensity at detector and is plotted on a histogram of excitation frequency versus photon count.

(iv) The frequency scan is repeated multiple times to build up a statistically significant histogram with a well-defined peak, for example as illustrated in FIG. 17.

(v) The stability is characterised by the full width at half maximum ("FWHM") of the peak in the histogram.

In the above method, the detector used can be a conventional spectrometer as its function is to measure the intensity of the "reflected" radiation as the laser scans rather than the frequency.

In the above method, "photo bleaching" (i.e. the electron is lost from NV centre) can occur, particularly when the excitation power is increased. The bleaching can be reversed through application of a "repump" laser at, for example, 532 nm or 488 nm. The repump has sufficient energy to excite electrons from single substitutional nitrogen impurities to the conduction band, and these electrons can be recaptured by NV centres. This process is not deterministic and does not always leave the NV centre in the NV$^-$ charge state. The repump can be applied either continuously or as pulses in between PLE scans, but continuous repumping causes rapid blinking and possibly spectral diffusion during a single PLE scan. A pulsed repump in between scans can allow a single scan to be completed without interruption, but may cause blinking or spectral jumps from scan to scan.

The theoretical minimum value of the FWHM of the peak of the histogram of the number of photons having a particular frequency versus the frequency of the photon is approximately 13.3 MHz. This value would apply to a single NV centre in an otherwise perfect isotopically pure diamond with no other point defects or extended defects.

Preferably, in the solid state systems of the present invention, the stability of a transition from the $m_s=\pm 1$ excited state to the $m_s=0$ ground state is such that the FWHM of the peak of a histogram of the number of photons having a particular frequency versus the frequency of the photon is about 500 MHz or less, preferably about 300 MHz or less, preferably about 200 MHz or less, preferably about 150 MHz or less, preferably about 100 MHz or less, preferably about 80 MHz or less, preferably about 50 MHz or less, wherein the number of photons over which the FWHM is evaluated is about $5\times10^5$ or greater, preferably about $10^6$ or greater, preferably about $10^7$ or greater, preferably about $10^8$ or greater.

The solid state system of the present invention may be a quantum repeater, a quantum cryptography device or a quantum computing device or magnetometer or other spintronic device.

FIGURES

The following figures are intended to illustrate the invention:

FIG. 9(a) shows the energy level schemes for the $^{15}$NV$^-$ and $^{14}$NV$^-$ centres;

Figure 16:
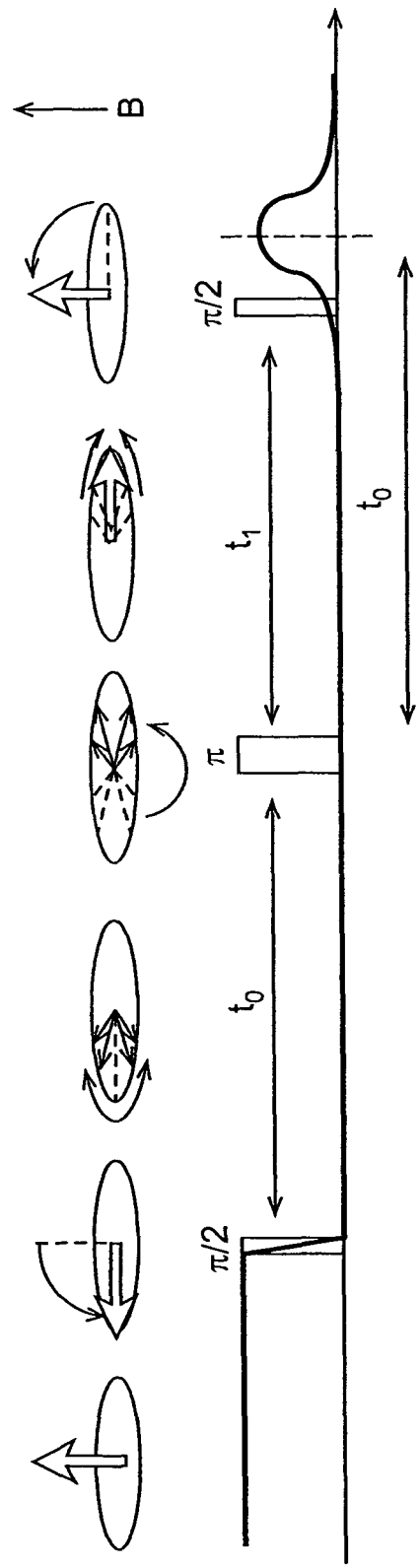
Figure 17:
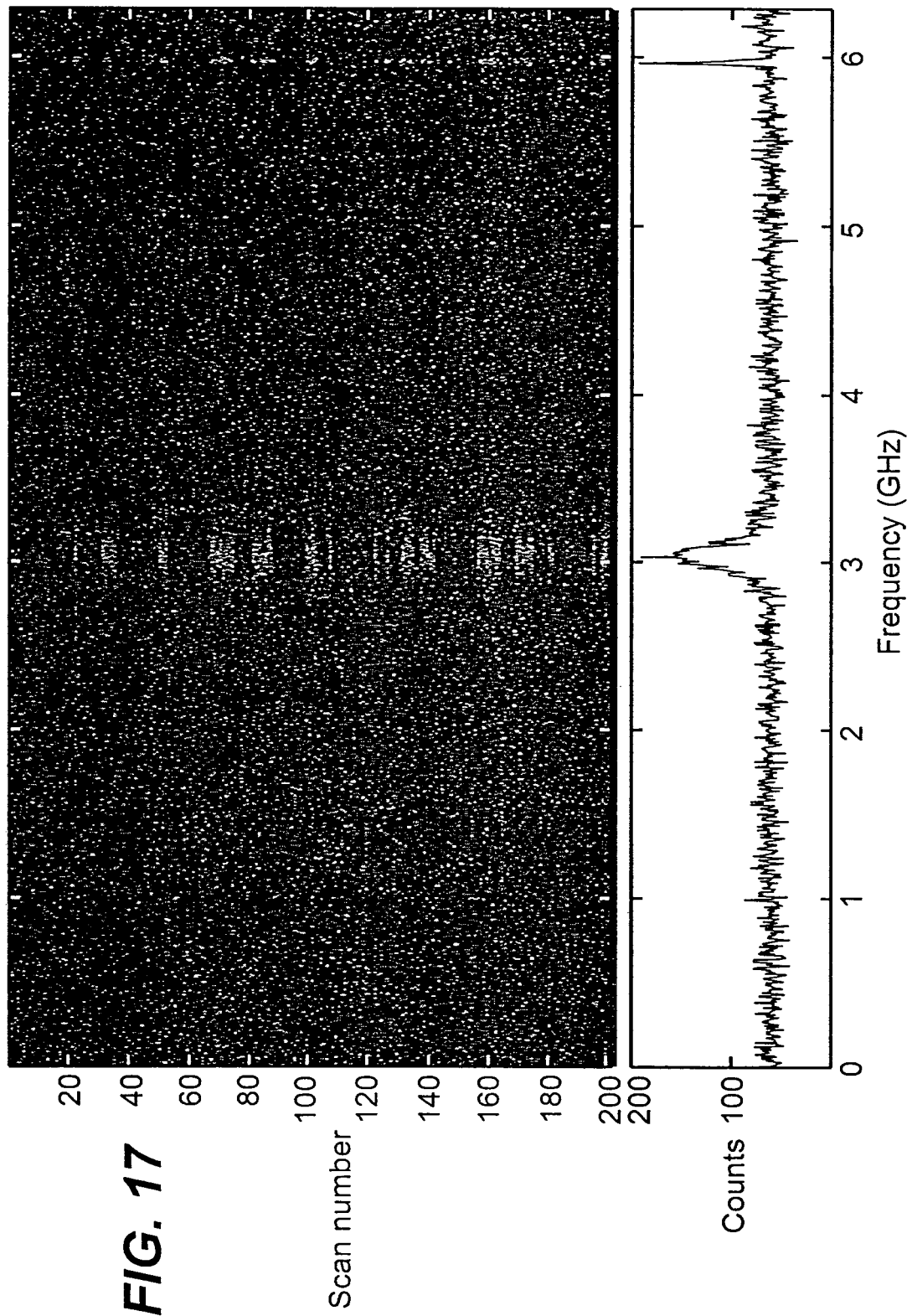

FIG. 16 shows a series of transformations using microwave pulses which flip the spin of the NV centre; and FIG. 17 shows results of a single NV centre where multiple PLE scans are performed (with a re-pump pulse every few scans) and the histogram of the frequency of the emitted photon against number of times the emission is at that frequency showing that the full width at half maximum for the peak is approximately 250 MHz.

Figure 9B:
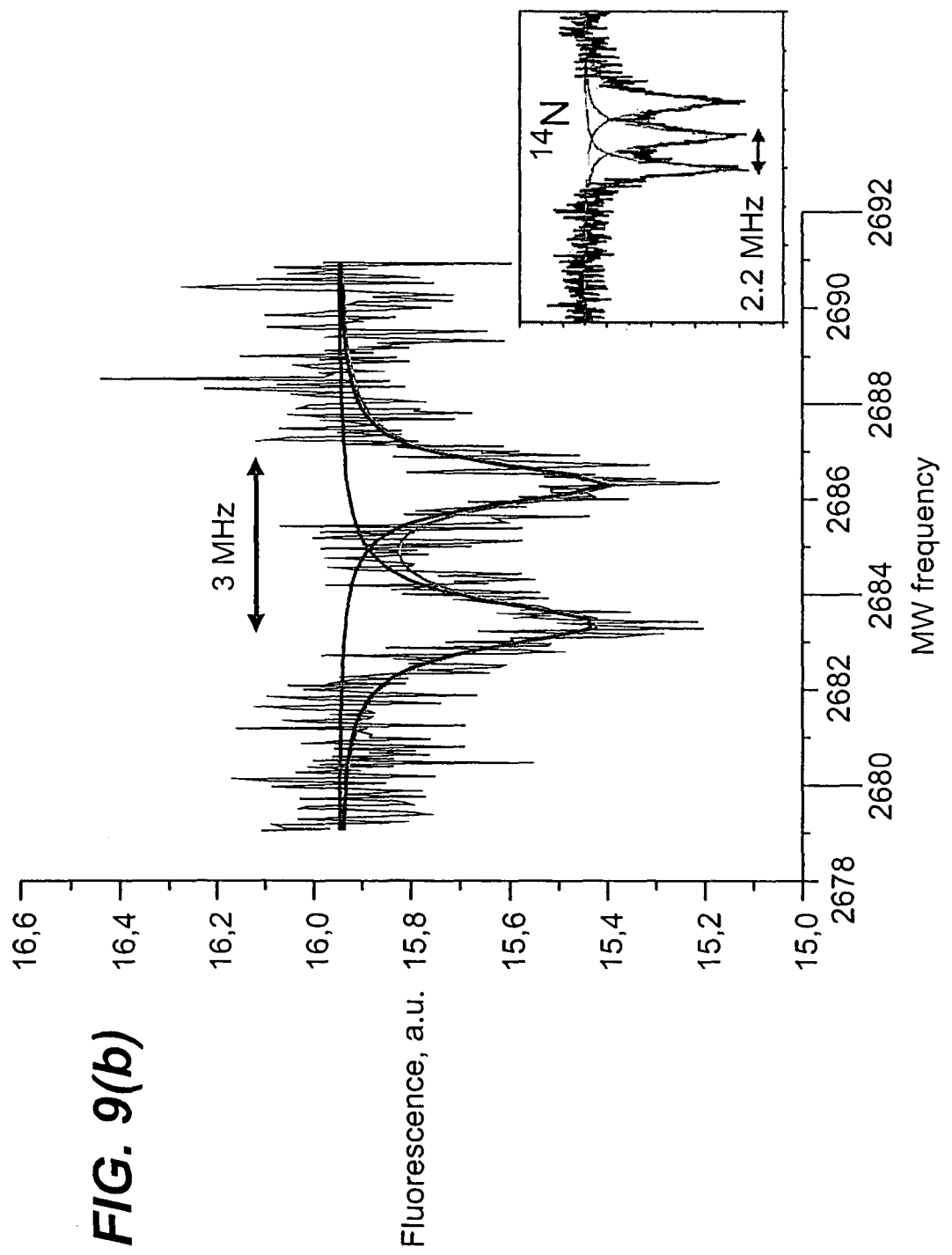
FIG. 9(b) shows the optically detected electron paramagnetic resonance spectra from a $^{15}$NV$^-$ centre with the inset showing the same spectra for $^{14}$NV$^-$ centre.

As discussed above, the NV centres in diamond have more than one magnetic spin state and can therefore be used for qubit applications. FIG. 9(a) shows the energy level schemes for the $^{15}$NV$^-$ and $^{14}$NV$^-$ centres, showing the difference in hyperfine coupling energies in the ground state spin structure. The spin structure of these centres can also be seen in the optically detected magnetic resonance spectra in FIG. 9(b). FIGS. 9(a) and 9(b) clearly show the non-degeneracy of the magnetic spin states for the NV centres. As FIG. 9(a) shows, there are a number of allowed transitions between the magnetic spin states by which the NV centre occupying a higher energy magnetic spin state may lose energy. The energy lost when the NV centre undergoes a transition from a high energy magnetic spin state to a low energy magnetic spin state may be emitted as a photon and therefore may be detected and characterised using a light detector.

Figure 10A:
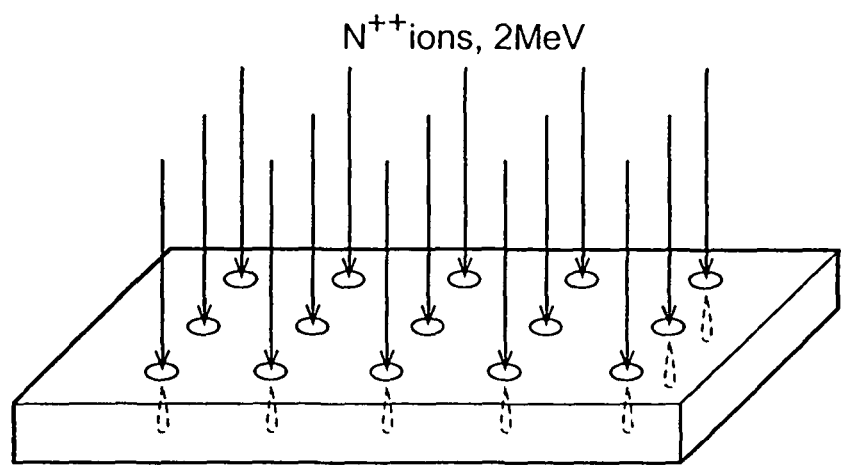
FIG. 10(a) shows a schematic representation of implantation of a two-dimensional array of $^{15}$N ions into synthetic diamond material to form a two dimensional array of $^{15}$NV centres.

FIG. 10(a) shows a schematic representation of implantation of NV centres into synthetic diamond material. In this figure, the NV centres are formed by the implantation of N$^{++}$ ions at an energy of 2 MeV (mega electron volts). The NV centres shown in this figure are all implanted at the same energy and form a 2-dimensional array.

Figure 10B:
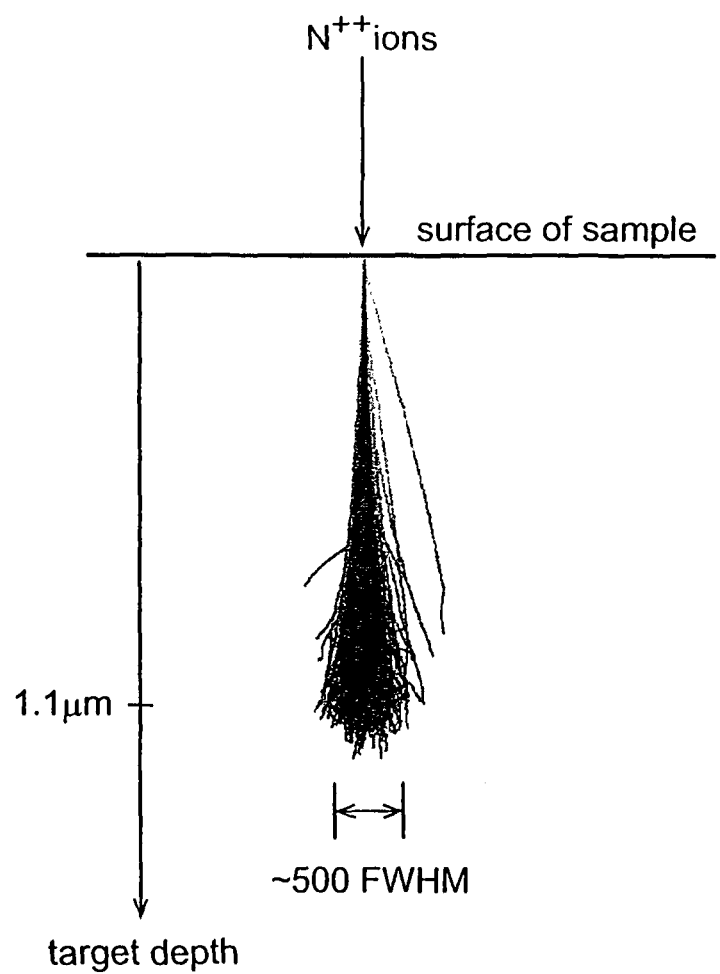
FIG. 10(b) shows the result of Monte-Carlo simulation representing the paths and end points of high energy nitrogen ions in a diamond structure during implantation.

FIG. 10(b) shows the result of Monte-Carlo simulation representing the path of high energy nitrogen ions in diamond structure during implantation. The distribution of the final locations of the ions has a mean depth of about 1.1 μm and the distribution is characterised laterally by a full width at half maximum of about 0.5 μm. In this figure, the NV centres are formed by the implantation of $N^{++}$ ions at an energy of 2 MeV. The paths of the implanted ions are not straight, but are made up of series of straight segments between collisions with the carbon atoms of the diamond structure. Some of the collisions knock the carbon atoms off their normal sites to form self-interstitial carbon atoms and vacancies to form a damaged zone. The lateral spread of the damaged zone is roughly the same as that of the distribution of implanted $N^{++}$ ions, but there are many (e.g. $10^2$ to $10^3$) interstitials and vacancies formed per implanted $N^{++}$ ion.

Figure 11:
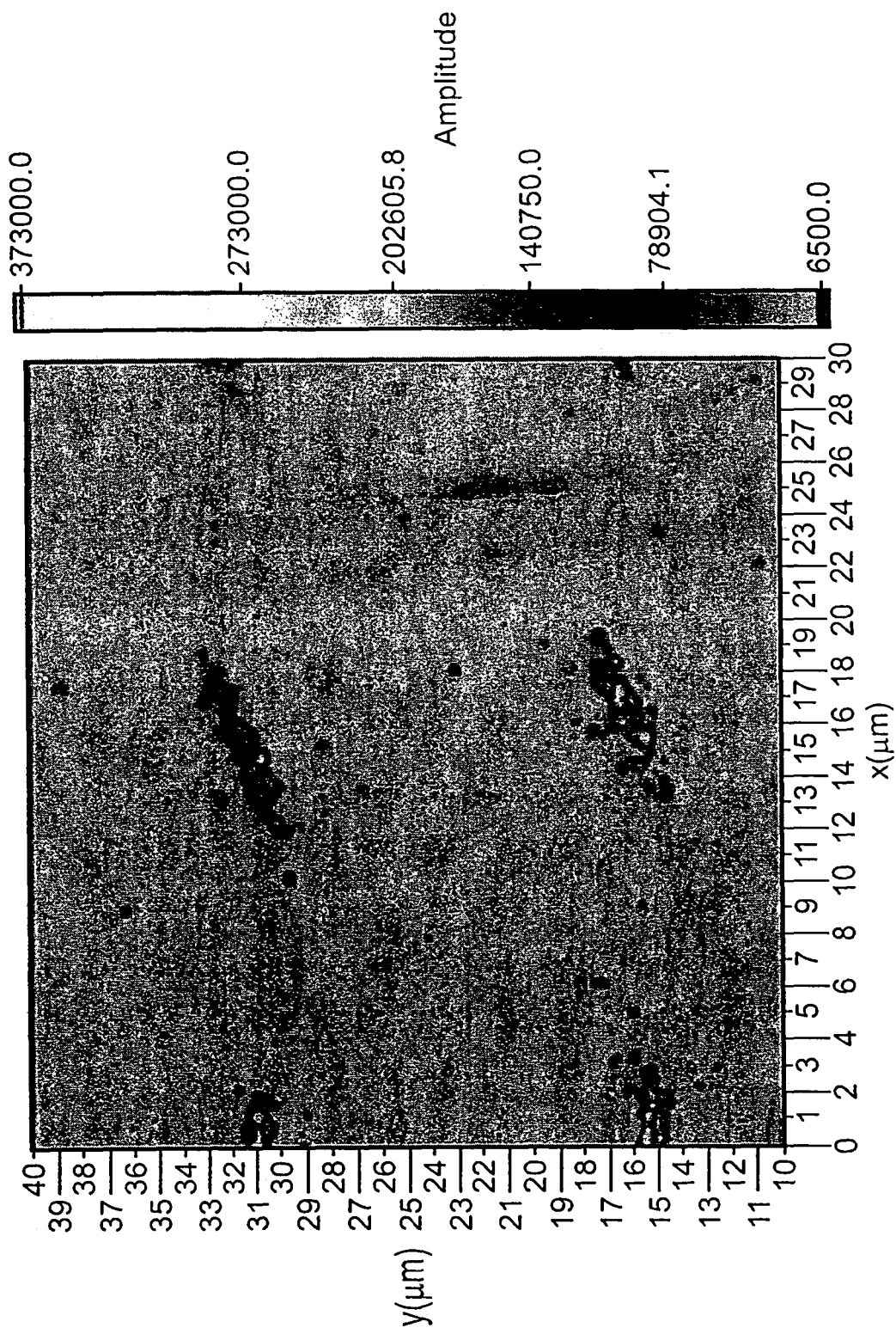
FIG. 11 shows a confocal fluorescence microscopy image of a 2-dimensional array of $^{15}$NV centres formed by ion implantation of $^{15}$N into a single crystal CVD diamond layer.
Figure 12:
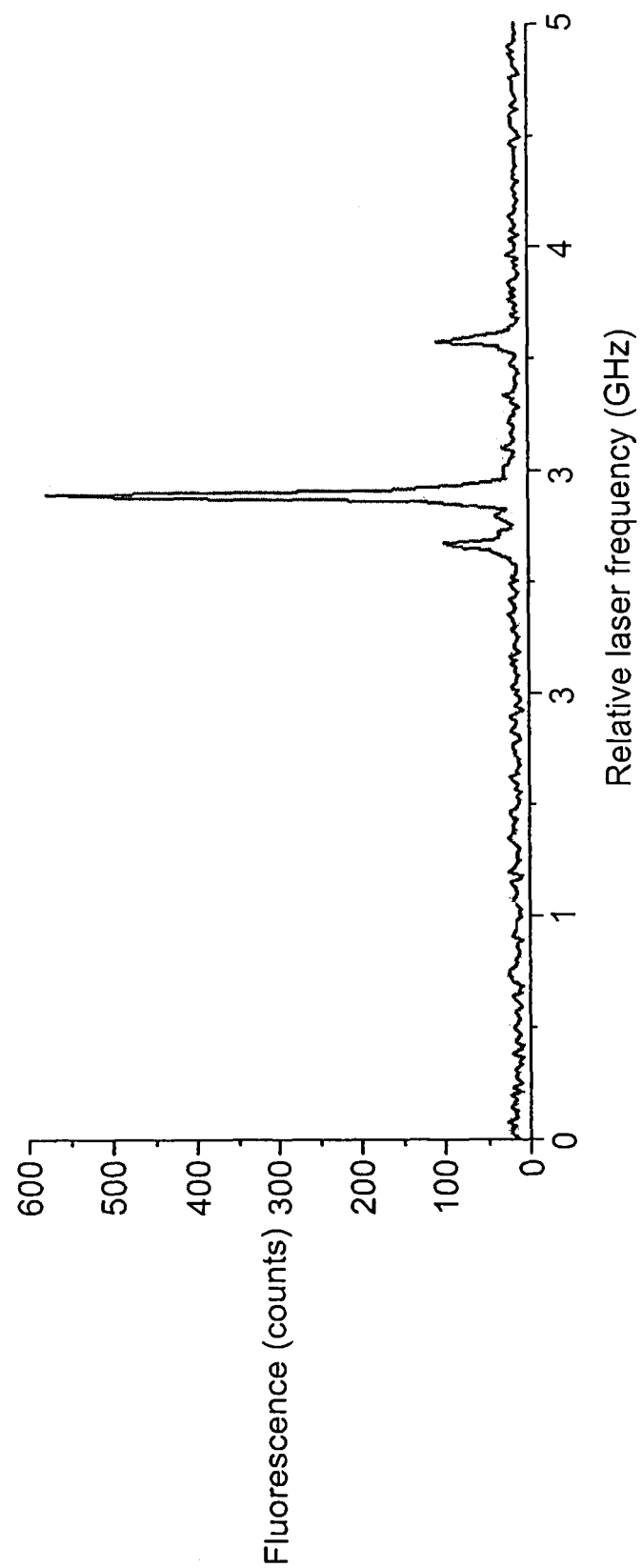
FIG. 12 shows the fluorescence excitation spectrum of an NV centre in a diamond layer of the present invention.
Figure 13:
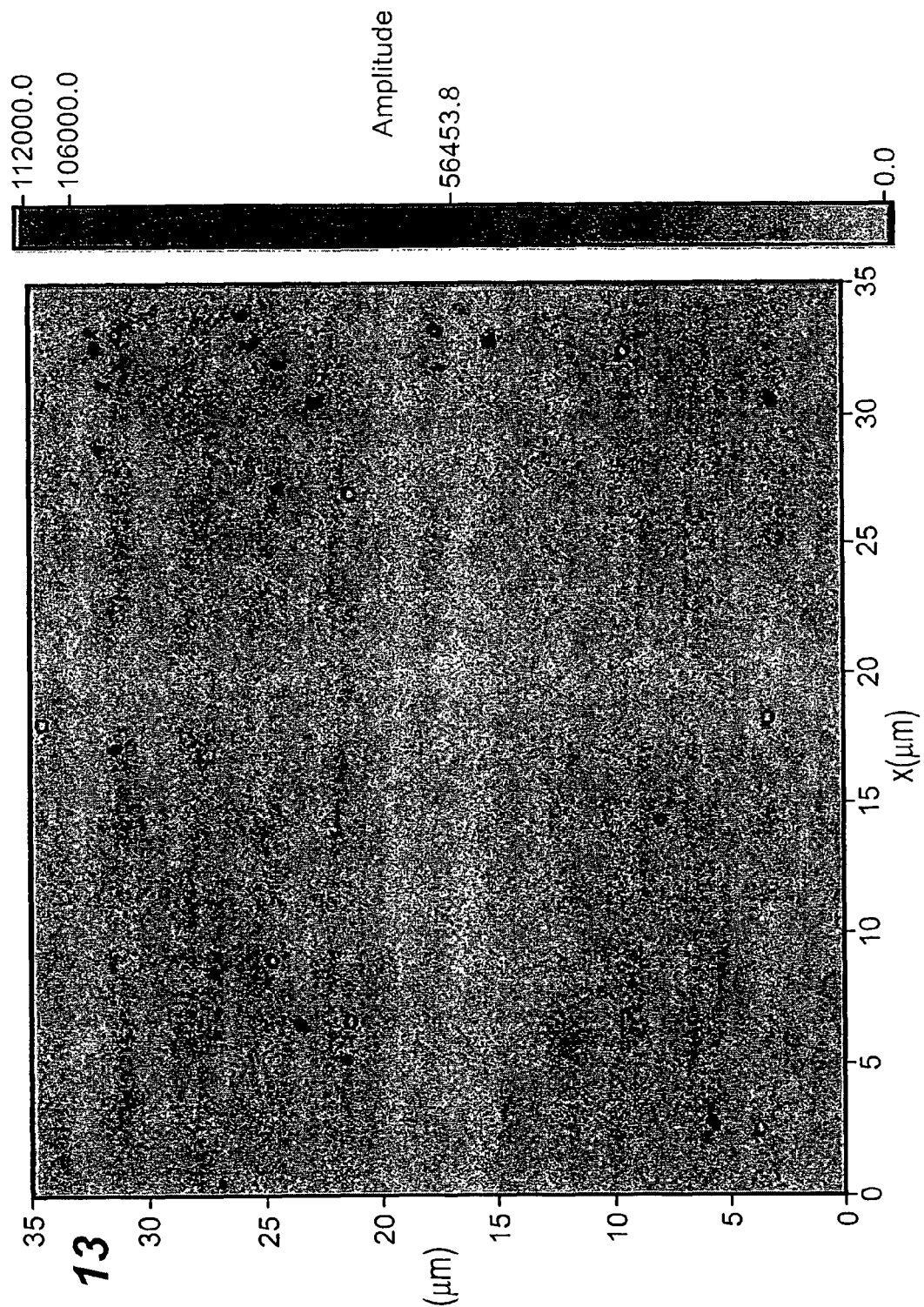
FIG. 13 shows a confocal fluorescence microscopy image of an area of a single crystal CVD diamond layer in which each spot corresponds to a single NV centre.
Figure 14:
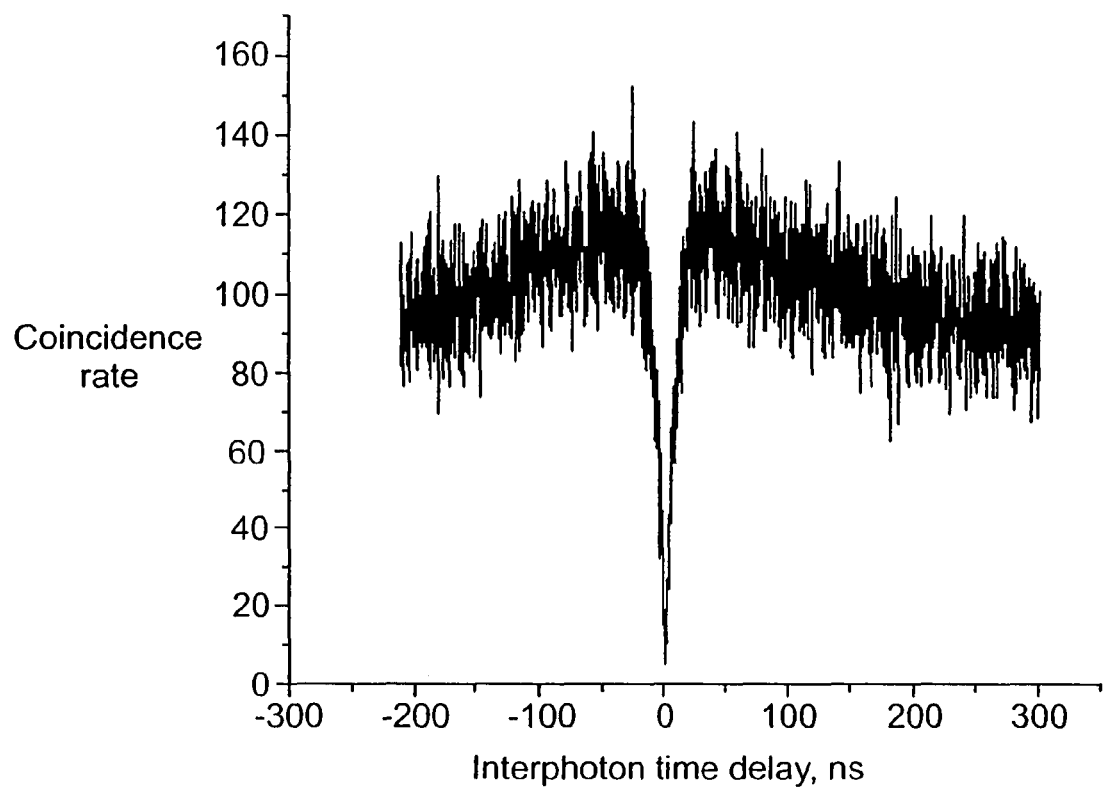
FIG. 14 shows that the time delay between successive photons ("interphoton time delay") has a coincidence rate of zero for a time delay of 0 ns, indicating that all the photons are from a single NV centre.

FIG. 11 shows a confocal fluorescence microscopy image of a 2-dimensional array of implanted NV centres in a single crystal CVD diamond layer. Each dot in the image corresponds to a single NV centre. The clusters of dots (of which four can be seen in a substantially square array) are the NV centres formed by the implantation process and the other randomly distributed dots are due to NV centres that are formed by the incorporation of nitrogen atoms and vacancies during the growth process (also referred to as "intrinsic NV centres").

Figure 15:
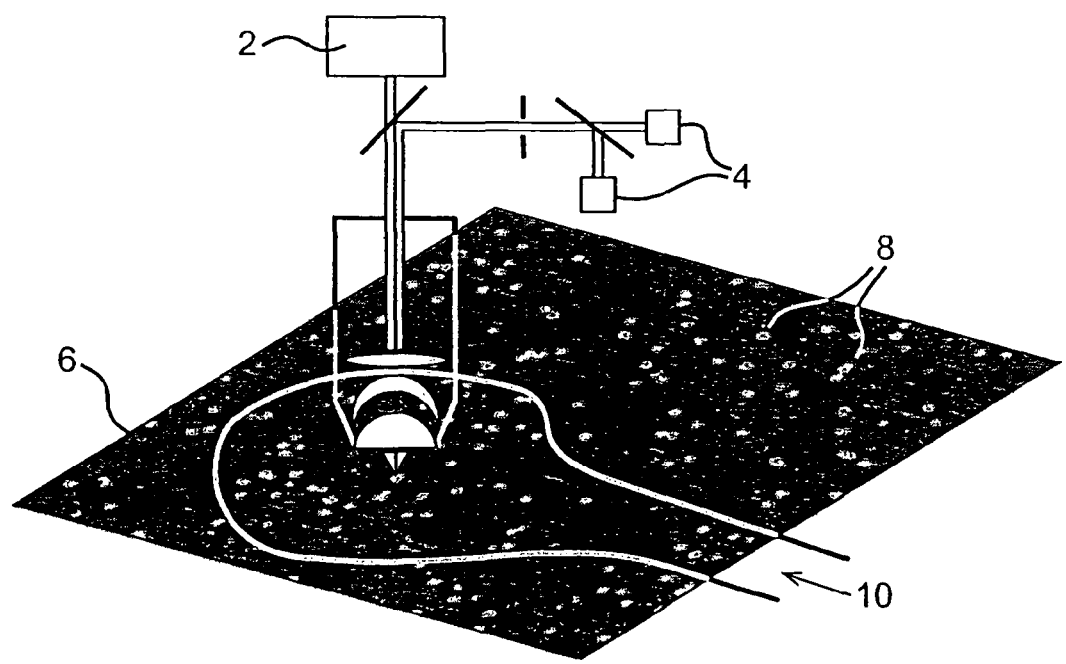
FIG. 15 shows a schematic arrangement whereby confocal microscopy (including confocal fluorescence microscopy) can be used to measure very low concentrations of NV centres and microwave or radio frequency signals can be used to excite electrons from ground to excited states.

In the confocal microscopy arrangement illustrated in FIG. 15, (2) is a laser, (4) are avalanche photodiodes (APDs), (6) is a diamond surface, (8) are single NV centres and (10) is microwave and radiofrequency.

The invention is further illustrated by the following examples. It will be appreciated that the examples are for illustrative purposes only and are not intended to limit the invention as described above. Modification of detail may be made without departing from the scope of the invention.

The T2 values of single NV centres were measured in single crystal CVD diamond. The choice of this particular centre is related to availability of optical readout which allows access to the spin state of individual centre.

EXAMPLES

Example 1

Substrates suitable for synthesising single crystal CVD diamond of the invention, and diamond material forming part of this invention, may be prepared as follows:
i) Selection of stock material (Ia natural stones and Ib HPHT stones) was optimised on the basis of microscopic investigation and birefringence imaging to identify substrates which were free of strain and imperfections.
ii) Laser sawing, lapping and polishing processes were used to minimise subsurface defects using a method of a revealing plasma etch to determine the defect levels being introduced by the processing.
iii) It was possible routinely to produce substrates in which the density of defects measurable after a revealing etch is dependent primarily on the material quality and is below $5 \times 10^3 /mm^2$, and generally below $10^2/mm^2$. Substrates prepared by this process are then used for the subsequent synthesis.

Figure 1:
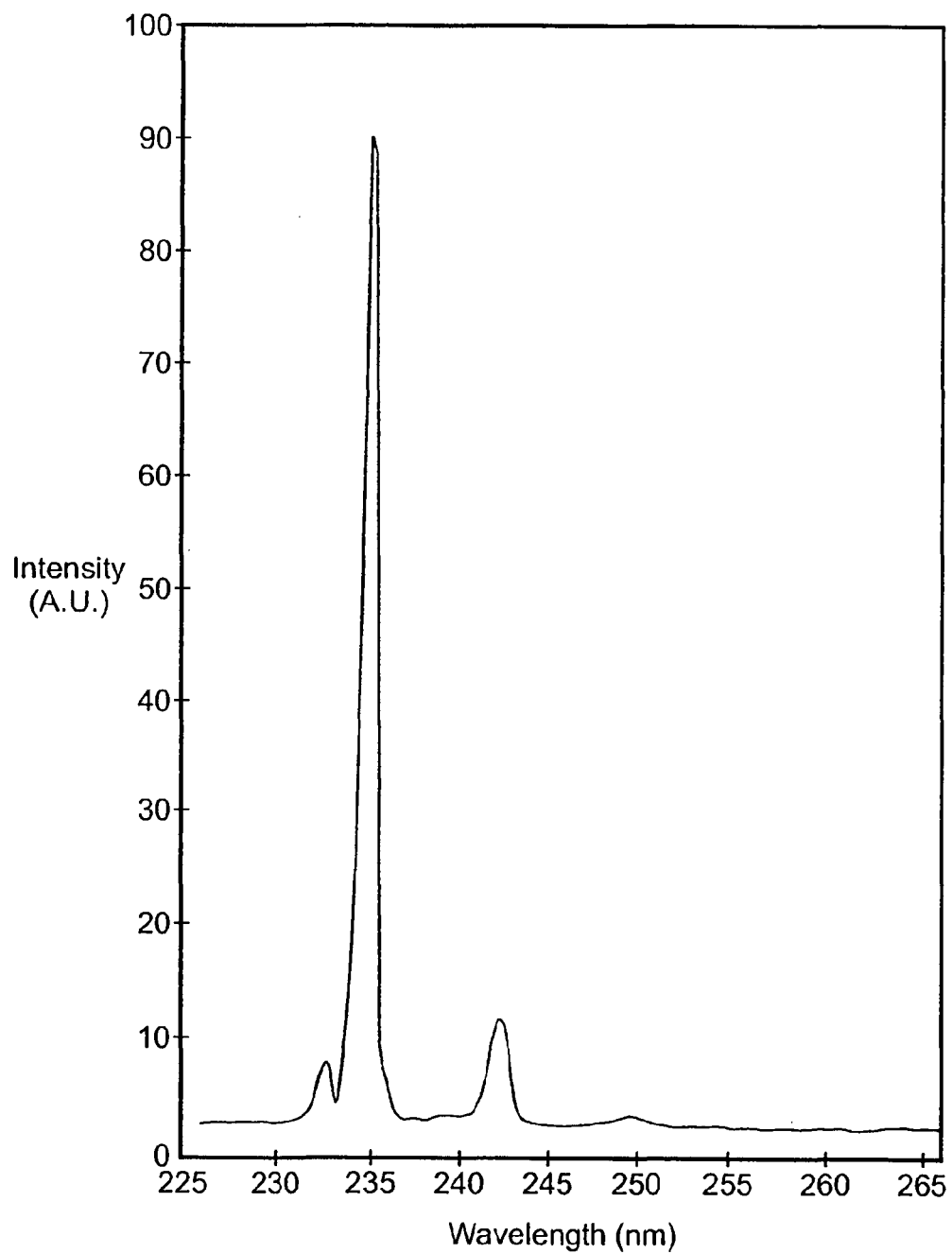
FIG. 1 shows a free exciton cathodoluminescence spectrum of HDS-1 at 77 K, showing strong emission at 235 nm (transverse optic mode)
Figure 2:
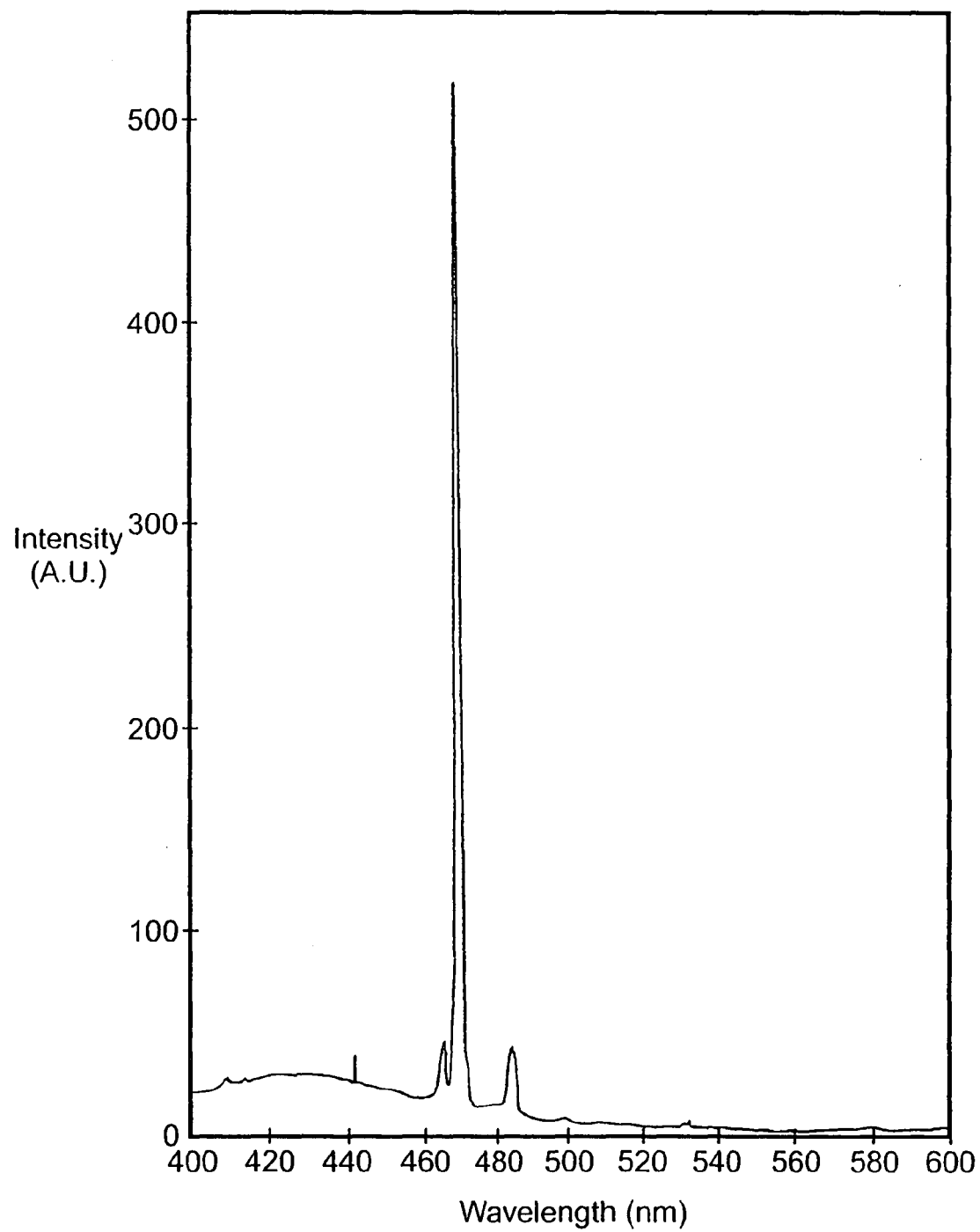
FIG. 2 shows a cathodoluminescence spectrum (77 K) of HDS-1, showing a broad weak band centred at approximately 420 nm, very weak lines at 533 nm and 575 nm and very intense free exciton emission (shown in second order at 470 nm)
Figure 3:
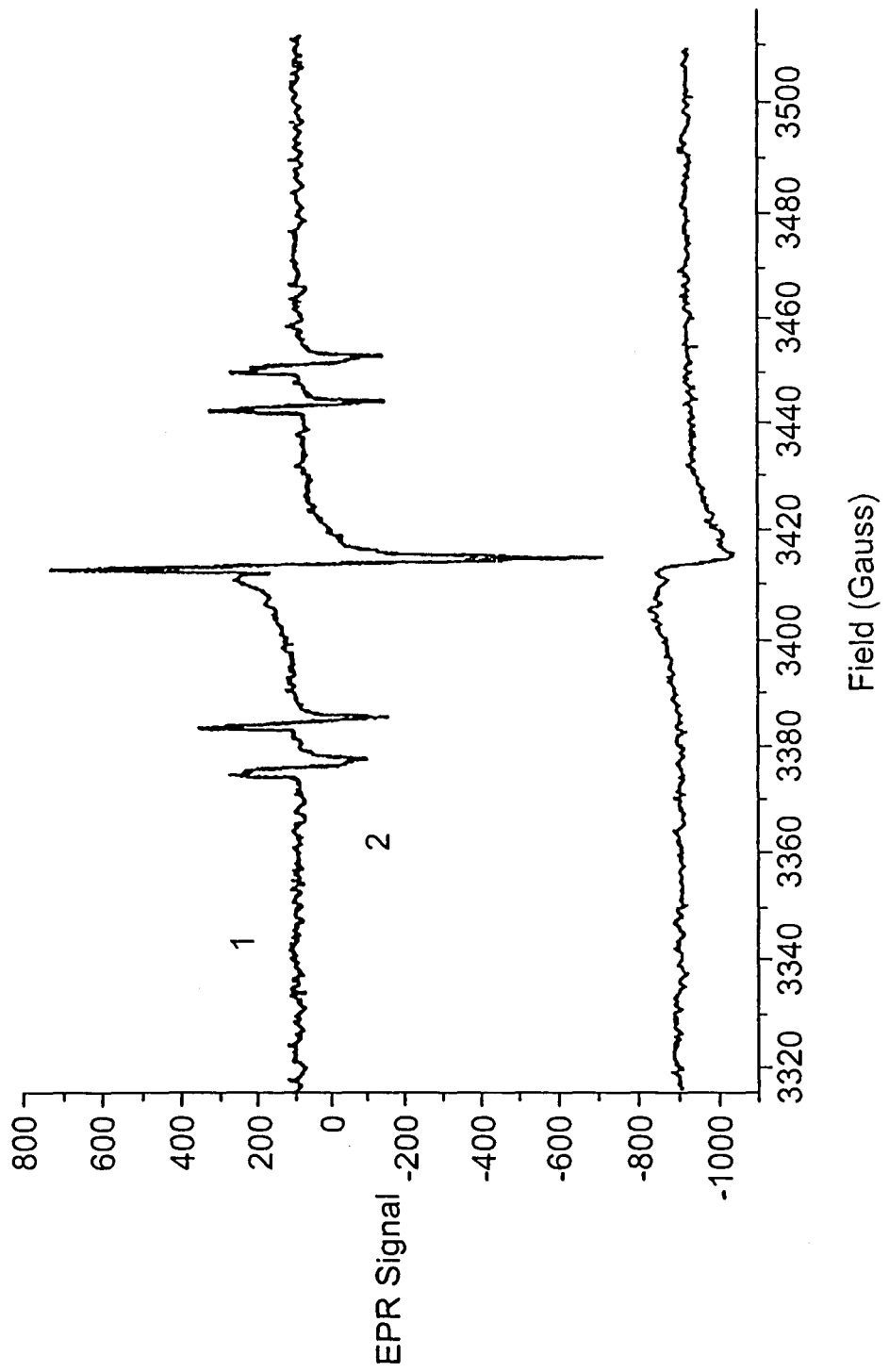
FIG. 3 shows room temperature EPR spectra of (1) homoepitaxial CVD diamond containing approximately 0.6 ppm of single substitutional nitrogen and (2) HDS-1. The spectra were measured under the same conditions and the samples were approximately the same size.
Figure 4:
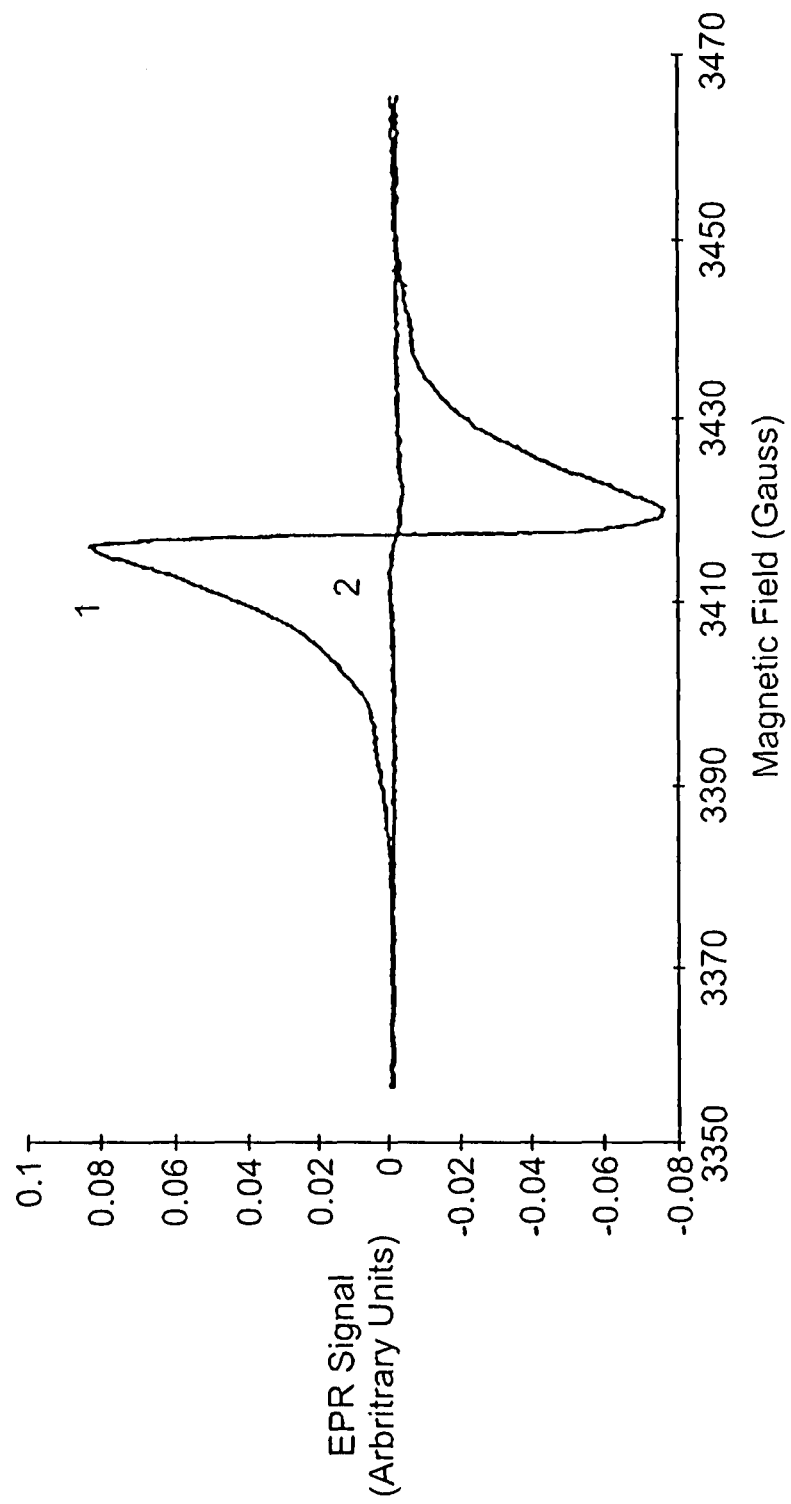
FIG. 4 shows EPR spectra recorded at 4.2 K of (i) high purity homoepitaxial CVD diamond grown simultaneously with HDS-1 which was plastically deformed after growth to demonstrate the influence on the EPR signal of structural defects created by indentation and (ii) HDS-1. The spectra were measured under the same conditions.
Figure 5:
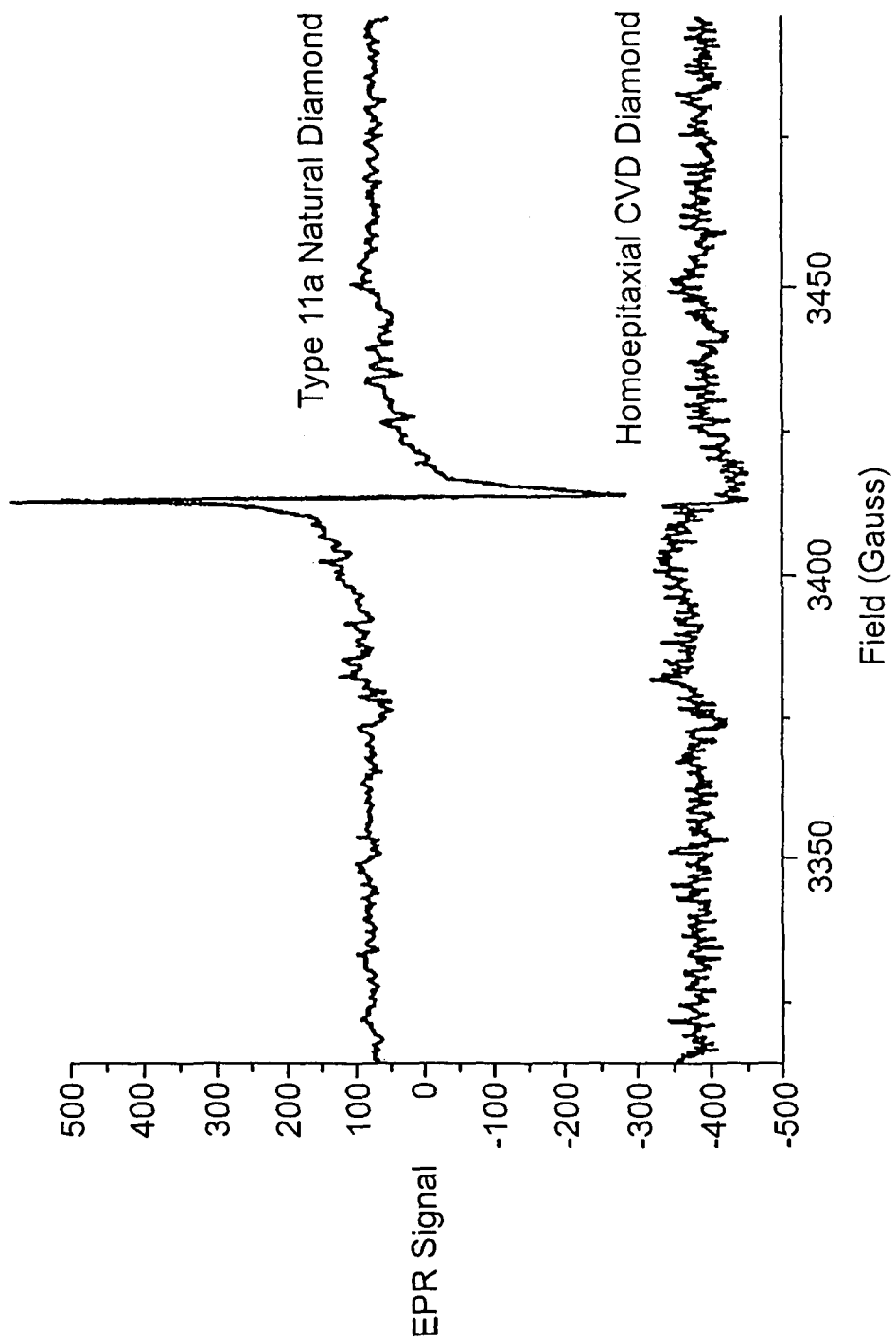
FIG. 5 shows room temperature EPR spectra of type IIa natural diamond and HDS-1. The spectra were measured under the same conditions and the samples were of the same size.
Figure 6:
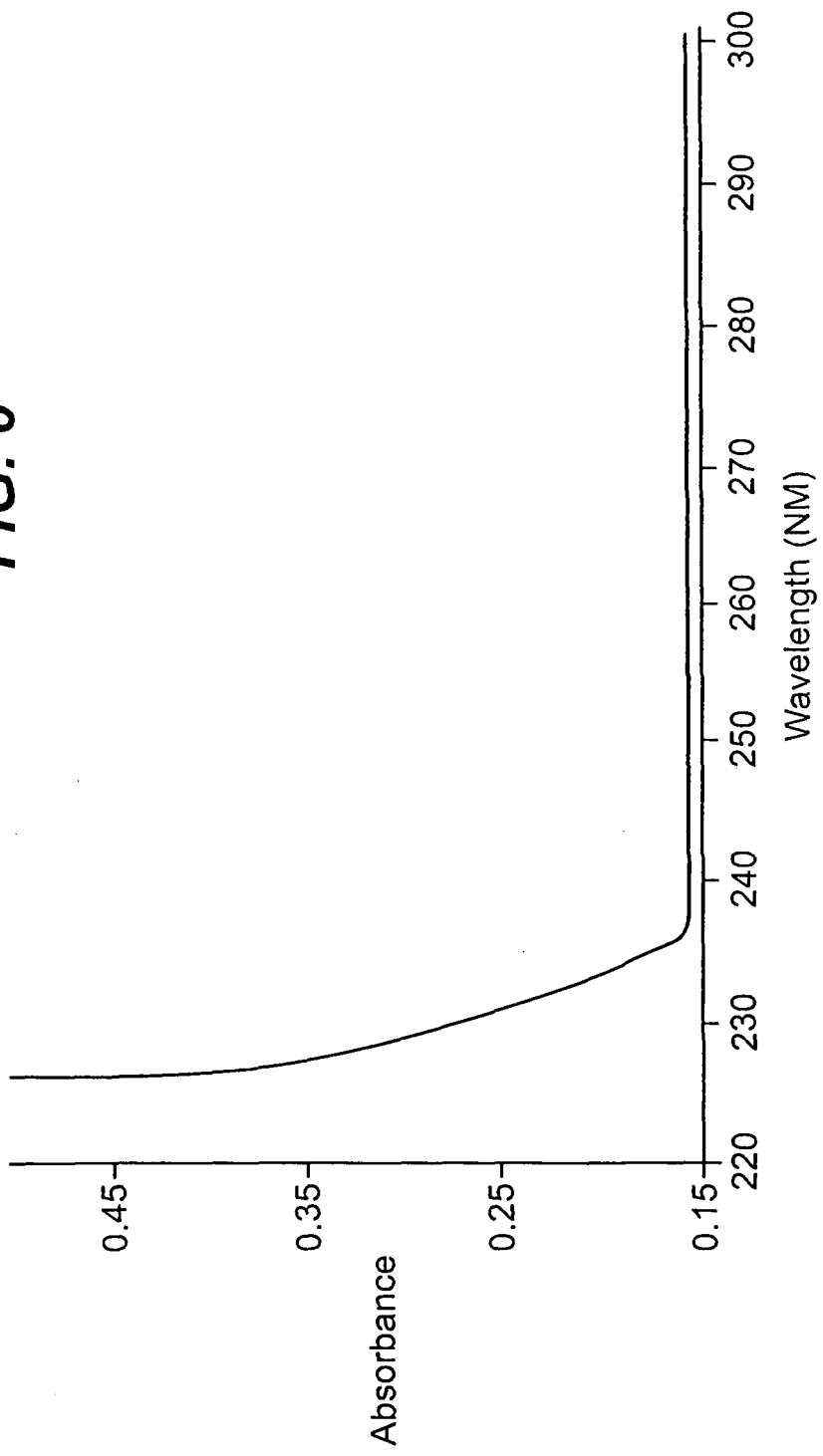
FIG. 6 shows room temperature ultraviolet absorption spectrum of HDS-1, showing the intrinsic absorption edge and the absence of the absorption band centred at 270 nm attributed to single substitutional nitrogen.
Figure 7:
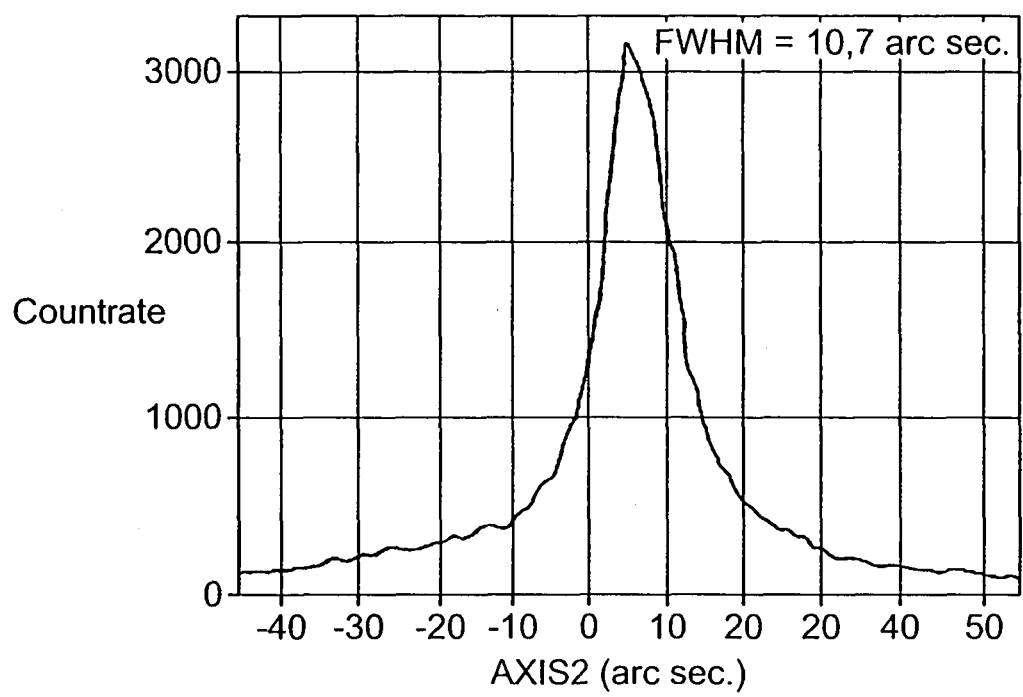
FIG. 7 shows a double axis X-ray rocking curve of HDS-1.
Figure 8:
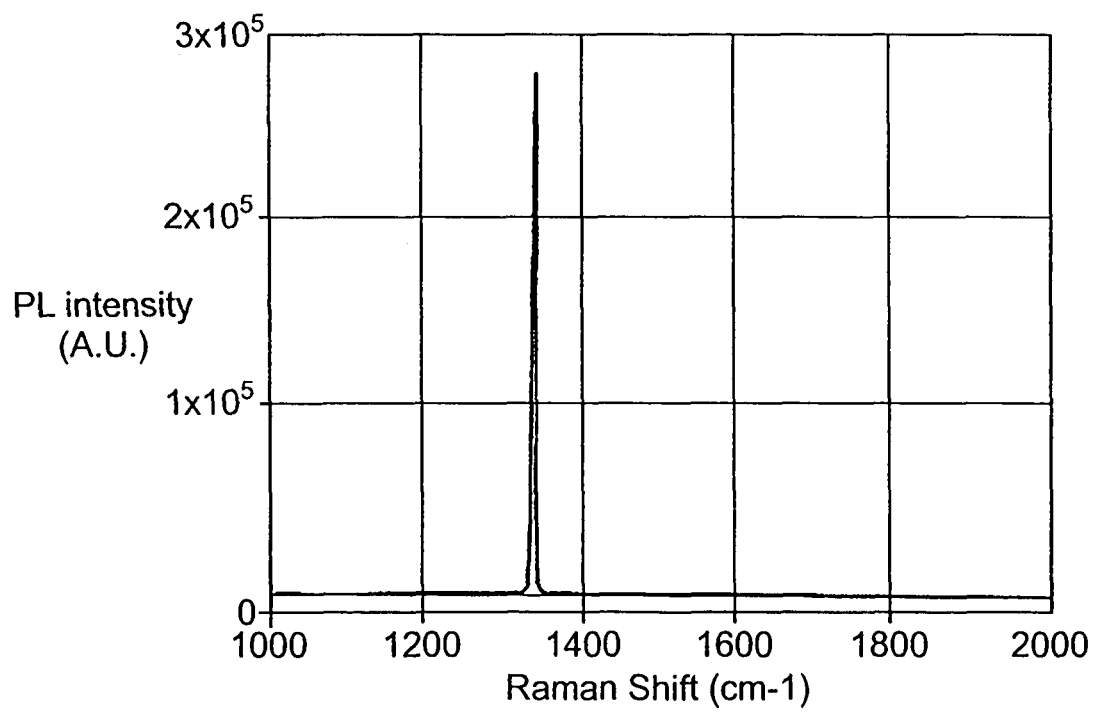
FIG. 8 shows a Raman spectrum of HDS-1 measured at 300 K using the 488 nm line of an argon ion laser.

A high temperature/high pressure synthetic type Ib diamond was grown in a high pressure press, and then prepared as a substrate using the method described above to minimise substrate defects. In finished form the substrate was a plate 5×5 mm square by 500 μm thick, with all faces {100}. The surface roughness at this stage was less than 1 nm $R_A$. The substrate was mounted on a tungsten substrate using a high temperature braze suitable for diamond. This was introduced into a reactor and an etch and growth cycle commenced as described above, and more particularly:
1) The reactor was pre-fitted with point of use purifiers, reducing nitrogen levels in the incoming gas stream to below 80 ppb, as determined by the modified GC method described above.
2) An in situ oxygen plasma etch was performed using 30/150/1200 sccm (standard cubic centimeter per second) of $O_2/Ar/H_2$ at $333 \times 10^2$ Pa and a substrate temperature of 800° C.
3) This moved without interruption into a hydrogen etch with the removal of the $O_2$ from the gas flow.
4) This moved into the growth process by the addition of the carbon source which in this instance was $C_4$ flowing at 30 sccm. The growth temperature at this stage was 980° C.
5) The atmosphere in which the growth took place contained less than 100 ppb nitrogen, as determined by the modified GC method described above.
6) On completion of the growth period, the substrate was removed from the reactor and the CVD diamond layer removed from the substrate.
7) This layer was then polished flat to a 410 μm thick layer, cleaned and oxygen ashed to produce a surface terminated by O and tested for its charge collection distance. This was found to be 380 μm at an applied field of 1 V/μm (a value invariably limited by the sample thickness) giving a lower limit for the product of mobility and lifetime, μτ, of $3.8 \times 10^{-6}$ cm$^2$/V.
8) The resistivity of the diamond layer, in the off state, was found to be $6 \times 10^{14}$ Ωcm when measured at 20° C. at an applied field of 50 V/μm.
9) The layer, identified as HDS-1, was further characterised by the data provided below and in the attached FIGS. 1 to 8:
   i) The CL spectra showing low blue band, low 575 nm and high FE emissions (FIGS. 1 and 2).
   ii) EPR spectra, showing low substitutional nitrogen and a weak g=2.0028 line (FIGS. 3 to 5).
   iii) Optical spectra showing the near theoretical transmission (FIG. 6).
   iv) X-ray rocking curves map, showing the angular spread of the sample to be less than 10 arc sec (FIG. 7).
   v) Raman spectrum showing a line width (FWHM) to be about 2 cm$^{-1}$ (FIG. 8).

Example 2

The procedure set out in Example 1 was repeated with the following variation in conditions:
Ar 75 sccm, $H_2$ 600 sccm, $CH_4$ 30 sccm, 820° C., 7.2 kW, less than 200 ppb nitrogen, as measured by the modified GC method described above.

The CVD diamond layer produced was processed to a layer 390 μm thick for testing. The μτ product was found to be $320 \times 10^{-6}$ cm$^2$N for electrons and $390 \times 10^{-6}$ cm$^2$/V for holes (measured at 300 K), giving a mean value of $355 \times 10^{-6}$ cm$^2$/V.

Example 3

The procedure set out in Example 1 was further repeated with the following variation in conditions:

Ar 150 sccm, H$_2$ 1200 sccm, CH$_4$ 30 sccm, 237×10$^2$ Pa and a substrate temperature of 822° C., less than 100 ppb nitrogen, as measured by the modified GC method described above.

The CVD diamond layer produced was processed to a layer 420 μm thick for testing. The collection distance of the layer was measured to be >400 μm. The resistivity the layer at an applied field of 50V/μm exceeded 1×10$^{14}$ Ωcm.

Example 4

The procedure set out in Example 1 was further repeated with the following variations in conditions:

The oxygen plasma etch used 15/75/600 sccm of O$_2$/Ar/H$_2$. This was followed by a hydrogen etch using 75/600 sccm Ar/H$_2$. Growth was initiated by the addition of the carbon source which in this instance was CH$_4$ flowing at 30 sccm. The growth temperature at this stage was 780° C.

The CVD diamond layer produced had a thickness of 1500 μm, and was processed into a layer 500 μm thick for testing.
1) The charge collection distance was found to be 480 μm at an applied field of 1 V/μm and 300 K, (a value limited by the sample thickness) giving a lower limit to the product of mobility and lifetime, μτ, 4.8×10$^{-6}$ cm$^2$/V.
2) The μτ product measured at 300 K using the Hecht relationship, as described above, was 1.7×10$^{-3}$ cm$^2$/V and 7.2×10$^{-4}$ cm$^2$/V for electrons and holes respectively.
3) A space charge limited time of flight experiment measured the electron mobility, μ$_e$ to be 4400 cm$^2$V/s at a sample temperature of 300 K.
4) A space charge limited time of flight experiment measured μ$_h$, the hole mobility, to be 3800 cm$^2$/Vs at a sample temperature of 300 K.
5) SIMS measurements showed that there is no evidence for any single defect present in concentrations above 5×10$^{16}$ cm$^{-3}$ (excluding H and its isotopes).
6) The measured resistivity was in excess of 5×10$^{14}$ Ωcm at an applied voltage of 100 V/μm as measured at 300 K.
7) The PL spectrum showed low blue band and low 575 nm intensity (<1/1000 of Raman peak). The Raman FWHM line width was 1.5 cm$^{-1}$. The CL spectrum showed a strong FE peak.
8) EPR spectra showed no (<7 ppb) substitutional nitrogen, and no (<10 ppb) g=2.0028 line.

Example 5

Samples of materials produced according to Examples 1 to 4 were subjected to further treatment to render them suitable for spintronic applications.

One sample, the major surfaces of which had previously been subject to mechanical processing using a scaif polishing technique, was further surface processed using an Ar—Cl$_2$ ICP etch using the following conditions:
platen power ~300 W;
coil power ~400 W;
chamber pressure ~5 mTorr (~0.67 Pa);
gas flow rates Ar—25 sccm, Cl$_2$—40 sccm;
etching time ~15 minutes.

The R$_q$ of the surface measured using an atomic force microscope (Veeco "Dimension 3100") over a nominal area of 1 μm×1 μm was approximately 0.9 nm prior to etching and approximately 1.2 nm after removal of approximately 900 nm of material from the surface.

The T2 time of an NV centre was measured using the procedure as described elsewhere in the specification and was found to be approximately 650 μs.

The spectral stability is measured using the procedure described elsewhere in the specification and the FWHM of the peak of the histogram of the frequency of the emitted photon versus the number of times the emitted photon is that frequency is approximately 250 MHz measured over more than 10$^6$ photons.

Example 6

A sample was prepared according to Example 5.

The Ar—Cl$_2$ ICP etched surface was subjected to a microwave plasma revealing etch under the following conditions:
gas mixture: 30/150/1200 (all sccm) of O$_2$/Ar/H$_2$
pressure: 333×10$^2$ Pa
temperature: 800° C.
duration: 5 minutes The number of defects revealed in the surface by the etch was counted using an optical microscope and found to be approximately 5×10$^2$ mm$^{-2}$.

The invention claimed is:

1. A solid state system comprising a host material and a quantum spin defect, the host material comprising a layer of single crystal chemical vapor deposition (CVD) diamond having a total nitrogen concentration of about 20 ppb or less and a concentration of paramagnetic defects of about 1 ppm or less, and the quantum spin defect having an electronic spin state with a decoherence time (T2) at room temperature of between 500 μs and 1.8 ms wherein a surface roughness, R$_q$ of the layer of single crystal CVD diamond within an area defined by a circle of radius of about 5 μm centered on the point on a surface of the layer of single crystal CVD diamond nearest to where the quantum spin defect is formed is about 10 nm or less, wherein the quantum spin defect is a nitrogen-vacancy (NV) center disposed within the layer of single crystal CVD diamond, and wherein the NV center is positioned within about 100 μm of the surface of the layer of single crystal CVD diamond.

2. A solid state system according to claim 1, wherein the stability of the transition from the m$_s$=±1 to the m$_s$=0 state for the quantum spin defect is such that the Full Width at Half Maximum (FWHM) of the peak of a histogram of the number of photons having a particular frequency versus the frequency of the photon is about 500 MHz or less.

* * * * *